(12) United States Patent
Chung et al.

(10) Patent No.: US 9,412,707 B2
(45) Date of Patent: Aug. 9, 2016

(54) METHOD OF MANUFACTURING SEMICONDUCTOR PACKAGE

(71) Applicant: Samsung Electronics Co., Ltd., Suwon-si, Gyeonggi-do (KR)

(72) Inventors: Hyun-soo Chung, Hwaseong-si (KR); Tae-je Cho, Yongin-si (KR); Jung-seok Ahn, Seoul (KR); In-young Lee, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/702,662

(22) Filed: May 1, 2015

(65) Prior Publication Data

US 2015/0364432 A1 Dec. 17, 2015

(30) Foreign Application Priority Data

Jun. 16, 2014 (KR) .................. 10-2014-0072974

(51) Int. Cl.
*H01L 29/40* (2006.01)
*H01L 23/00* (2006.01)
(Continued)

(52) U.S. Cl.
CPC ............ *H01L 23/562* (2013.01); *H01L 21/304* (2013.01); *H01L 21/4803* (2013.01); *H01L 21/561* (2013.01); *H01L 21/568* (2013.01); *H01L 21/6835* (2013.01); *H01L 21/6836* (2013.01); *H01L 21/76898* (2013.01); *H01L 21/78* (2013.01); *H01L 23/3114* (2013.01); *H01L 23/481* (2013.01); *H01L 25/0657* (2013.01); *H01L 25/50* (2013.01); *H01L 2221/6834* (2013.01); *H01L 2221/68327* (2013.01); *H01L 2221/68381* (2013.01); *H01L 2224/16145* (2013.01); *H01L 2224/16146* (2013.01); *H01L 2224/16225* (2013.01); *H01L 2224/97* (2013.01); *H01L 2924/15311* (2013.01); *H01L 2924/181* (2013.01)

(58) Field of Classification Search
None
See application file for complete search history.

(56) References Cited

U.S. PATENT DOCUMENTS 6,653,731 B2   11/2003   Kato et al.
7,919,834 B2   4/2011    Davis et al.
(Continued)

FOREIGN PATENT DOCUMENTS

JP   2009004644 A   1/2009
JP   2011187574 A   9/2011
(Continued)

*Primary Examiner* — Angel Roman
(74) *Attorney, Agent, or Firm* — Renaissance IP Law Group LLP

(57) ABSTRACT

Embodiments of the inventive aspect include a method of manufacturing a semiconductor package including a plurality of stacked semiconductor chips in which edges of a semiconductor wafer substrate may be prevented from being damaged or cracked when the semiconductor package is manufactured at a wafer level, while a diameter of a molding element is greater than a diameter of the semiconductor wafer substrate. The molding element may cover a surface of the wafer substrate and the plurality of stacked semiconductor chips. Embodiments may include a wafer level semiconductor package including a circular substrate having a first diameter, a circular passivation layer attached to the circular substrate, the passivation layer having the first diameter, and a circular molding element covering surfaces of the plurality of semiconductor chips, and covering an active area of the substrate. The circular molding element may have a second diameter that is greater than the first diameter.

19 Claims, 16 Drawing Sheets

(51) Int. Cl.
  *H01L 23/48* (2006.01)
  *H01L 21/78* (2006.01)
  *H01L 21/304* (2006.01)
  *H01L 21/683* (2006.01)
  *H01L 25/00* (2006.01)
  *H01L 25/065* (2006.01)
  *H01L 21/768* (2006.01)
  *H01L 21/48* (2006.01)
  *H01L 23/31* (2006.01)
  *H01L 21/56* (2006.01)

(56) References Cited

U.S. PATENT DOCUMENTS

| | | | |
|---|---|---|---|
| 8,110,910 B2 | 2/2012 | Kim | |
| 8,129,277 B2 | 3/2012 | Kimura et al. | |
| 8,373,261 B2 | 2/2013 | Kim et al. | |
| 8,426,256 B2 | 4/2013 | Hsiao et al. | |
| 8,441,136 B2 | 5/2013 | Chiou et al. | |
| 8,455,301 B2 * | 6/2013 | Lee | H01L 21/561 257/622 |
| 8,569,861 B2 | 10/2013 | Iriarte et al. | |
| 8,642,385 B2 | 2/2014 | Xue et al. | |
| 8,791,562 B2 | 7/2014 | Lee et al. | |
| 8,937,309 B2 * | 1/2015 | England | H01L 21/568 257/48 |
| 9,219,042 B2 * | 12/2015 | Paek | H01L 24/11 |
| 2009/0004777 A1 * | 1/2009 | Kolan | H01L 25/0657 438/109 |
| 2010/0144097 A1 | 6/2010 | Koroku et al. | |
| 2012/0018871 A1 | 1/2012 | Lee et al. | |
| 2013/0037935 A1 | 2/2013 | Xue et al. | |
| 2014/0070405 A1 * | 3/2014 | Agarwal | H01L 24/94 257/737 |
| 2015/0014820 A1 * | 1/2015 | Owada | H01L 21/6835 257/622 |
| 2015/0048500 A1 * | 2/2015 | Yu | H01L 24/19 257/737 |

FOREIGN PATENT DOCUMENTS

| | | |
|---|---|---|
| JP | 2011216763 A | 10/2011 |
| KR | 100388288 A | 6/2003 |
| KR | 20110105159 A | 9/2011 |

* cited by examiner

METHOD OF MANUFACTURING SEMICONDUCTOR PACKAGE

CROSS-REFERENCE TO RELATED APPLICATION

This application claims the benefit of Korean Patent Application No. 10-2014-0072974, filed on Jun. 16, 2014, in the Korean Intellectual Property Office, the disclosure of which is incorporated herein in its entirety by reference.

BACKGROUND

The inventive concept relates to a method of manufacturing a semiconductor package, and more particularly, to a method of manufacturing a semiconductor package by stacking a semiconductor chip, including through electrodes, on a semiconductor wafer.

Semiconductor products are being reduced in size while processing ever larger amount of data. Accordingly, semiconductor chips used in the semiconductor products need to be highly integrated and packaged as a single unit. The demand for size reduction not only accelerates the development of technologies related to chip-sized packages, but also, emphasizes the importance of packaging technologies that may improve the mechanical and electrical reliability when mounting semiconductor chips. In particular, when a semiconductor package is manufactured by stacking a plurality of semiconductor chips, the plurality of semiconductor chips may have a relatively large capacity, low power consumption, a high transmission rate, and may be highly efficient. When stacking the plurality of semiconductor chips, a micro-bump may be applied to a pin and a through electrode may be used to thus manufacture a small, high-integrated, and high capacity semiconductor package. But conventional approaches for manufacturing a semiconductor package having stacked semiconductor chips leave parts of the package susceptible to damage during the manufacturing process.

SUMMARY

The inventive concept provides a method of manufacturing a semiconductor package in which faults, which are generated during a process of manufacturing the semiconductor package by stacking a plurality of semiconductor chips on a semiconductor wafer, are reduced and reliability is increased by improving a handling property.

According to an aspect of the inventive concept, there is provided method of manufacturing stacked semiconductor packages. The method may include preparing a wafer substrate comprising a first surface in which an active area is formed and a second surface that is opposite to the first surface. The method may include forming a first through electrode extending by a predetermined length from the second surface toward the first surface. The method may include trimming an edge of the second surface in predetermined intervals and by a predetermined thickness, thereby forming a trimmed wafer substrate surface. The method may include forming a protection layer that covers the second surface and a first portion of the trimmed wafer substrate surface such that a second portion of the trimmed wafer substrate surface is exposed. The method may include forming an adhesive layer on a wafer carrier. The method may include attaching the wafer substrate and the protection layer on the adhesive layer such that the adhesive layer covers an upper surface and a side surface of the protection layer. The method may include exposing an upper portion of the first through electrode by grinding the first surface. The method may include stacking a plurality of semiconductor chips on the first surface, at least one of which is electrically connected to the first through electrode. The method may include forming a molding element to cover the first surface of the wafer substrate and the plurality of semiconductor chips, wherein a diameter of the molding element is greater than a diameter of the wafer substrate and less than respective diameters of the protection layer and the adhesive layer. The method may include sequentially removing the wafer carrier and the adhesive layer.

The method may further include, after removing the wafer carrier and the adhesive layer, further comprising performing a singulation process to form individual stacked semiconductor packages by cutting the wafer substrate and the molding element such that each of the stacked semiconductor packages comprises at least one stacked semiconductor chip.

The method may further include, after forming the first through electrode, forming a release layer that covers the second surface of the wafer substrate.

The release layer may be formed of polymer.

The method may further include forming an access pad on the second surface of the wafer substrate after forming the first through electrode, forming a passivation layer such that the second surface of the wafer substrate is covered, a side surface of the access pad is surrounded, and an upper surface of the access pad is exposed, and forming, on the protection layer, an external access terminal, which is electrically connected to the access pad.

The adhesive layer may be formed to cover a side surface of the trimmed edge of the second surface of the wafer substrate, and to cover the second portion of the trimmed wafer substrate surface.

The method may further include cleaning the wafer substrate after trimming the edge of the second surface.

The adhesive layer may be formed on the wafer carrier by using a spin coating method.

Attaching the wafer substrate and the protection layer on the adhesive layer of the wafer carrier may comprise attaching by curing the adhesive layer using a thermal bonding method.

The method may further include, after forming the molding element, turning over the wafer substrate and attaching the wafer substrate and the molding element to a dicing tape such that an upper surface of the molding element contacts the dicing tape.

According to another aspect of the inventive concept, there is provided a method of manufacturing a semiconductor package. The method may include forming a first semiconductor chip comprising a first surface on which an external access terminal is formed, and a first through electrode that penetrates at least a portion of an area between the first surface and a second surface that is opposite to the first surface. The method may include trimming an edge of the first surface in predetermined intervals and by a predetermined thickness. The method may include forming a first protection layer to cover a side surface of a trimmed edge of the first surface. The method may include forming a second protection layer to cover an exposed upper surface of the trimmed edge of the first surface and an upper surface and a side surface of the first protection layer. The method may include stacking a plurality of second semiconductor chips, at least one of which is connected to the first through electrode, on the second surface. The method may include forming a molding element such that upper surfaces and side surfaces of the plurality of second semiconductor chips are covered and the first and second protection layers are partially exposed. The method may include removing the second protection layer. The method may include trimming an edge of the first protection layer such that an edge of the molding element is partially exposed. The method may include removing the first protection layer.

The method may further include, after removing the first protection layer, performing a singulation process to form an individual semiconductor package by cutting the molding element and the first semiconductor chip such that at least one second semiconductor chip from among the plurality of second semiconductor chips is included in the individual semiconductor package.

The method may include after forming the external access terminal, forming a release layer on the first surface of the first semiconductor chip and an upper surface of the external access terminal by spin coating an ultraviolet film.

The first semiconductor chip and the plurality of second semiconductor chips may be different types of semiconductor chips.

The second protection layer may be formed as an adhesive layer, and after forming the second protection layer, the method may further include attaching the second protection layer to a wafer carrier.

Embodiments of the inventive concept may include a wafer level semiconductor package. The wafer level semiconductor package may include a circular substrate having a first diameter, a circular passivation layer attached to the circular substrate, the passivation layer having the first diameter, a plurality of access terminals arranged on the passivation layer, a plurality of first access pads each connected to a corresponding one of the access terminals, a plurality of first through electrodes each electrically connected to a corresponding one of the first access pads, the plurality of first through electrodes extending through the passivation layer and the substrate, a plurality of second access pads each electrically connected to a corresponding one of the first through electrodes, a plurality of first semiconductor chips each electrically connected to a corresponding one of the first through electrodes via a corresponding one of the second access pads, a plurality of second through electrodes each passing through a corresponding one of the plurality of first semiconductor chips, a plurality of second semiconductor chips each electrically connected to a corresponding one of the second through electrodes, and a circular molding element covering surfaces of the plurality of first semiconductor chips and the plurality of second semiconductor chips, and covering an active area of the substrate, the circular molding element having a second diameter that is greater than the first diameter.

BRIEF DESCRIPTION OF THE DRAWINGS

Exemplary embodiments of the inventive concept will be more clearly understood from the following detailed description taken in conjunction with the accompanying drawings in which:

FIGS. 2A to 14A are perspective views of the semiconductor package at various stages of manufacture, according to an embodiment of the inventive concept;

FIGS. 2B to 14B are cross-sectional views taken along lines of FIGS. 2A to 14A, respectively, of the semiconductor package at various stages of manufacture, according to an embodiment of the inventive concept;

DETAILED DESCRIPTION OF THE EMBODIMENTS

Figure 1A:
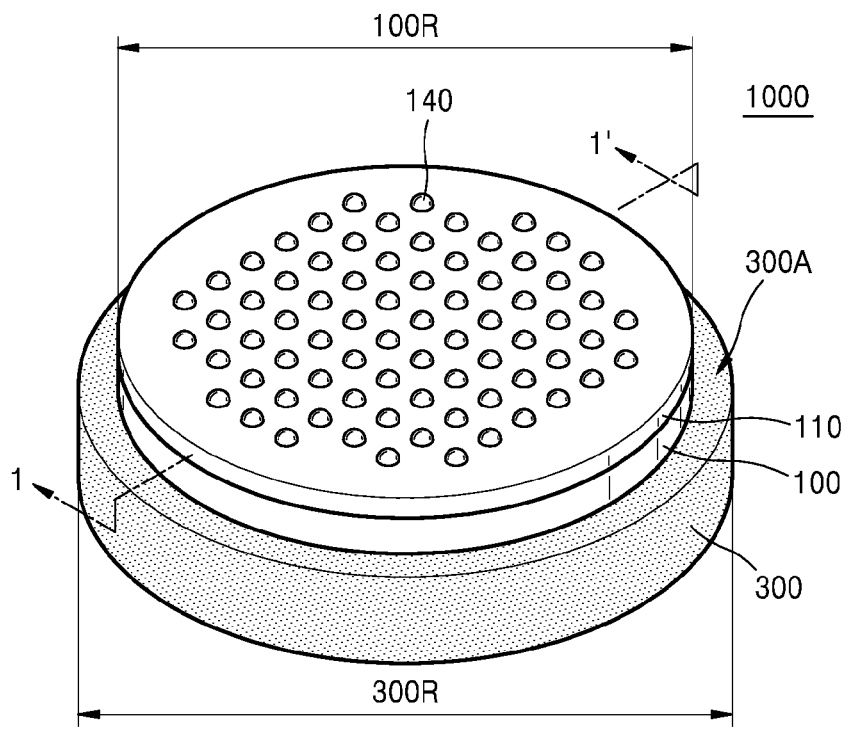
FIG. 1A is a perspective view of a semiconductor package according to an embodiment of the inventive concept.

Reference will now be made in detail to embodiments, examples of which are illustrated in the accompanying drawings. The embodiments of the present inventive concept are provided to fully describe the present inventive concept to one of ordinary skill in the art to which the present inventive concept pertains. The embodiments may have different forms and should not be construed as being limited to the descriptions set forth herein. Instead, the embodiments more fully convey the spirit and scope of the present inventive concept to one of ordinary skill in the art.

It will be understood that when a component, such as a layer, a film, a region, or a plate, is referred to as being "on" or "connected to" another component, the component can be directly on or connected to the other component or intervening components may be present thereon or therebetween. On the other hand, when a component is referred to as being "directly on" or "directly connected to" another component, no intervening components may be present thereon or therebetween. Like reference numerals refer to like elements throughout. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first," "second," etc. may be used herein to describe various members, areas, layers, portions, and/or components, these members, areas, layers, portions, and/or components should not be limited by these terms. These components do not indicate a specific order or superiority, but are only used to distinguish one member, area, layer, portion or component from another. Therefore, first members, areas, portions, or components may indicate second members, areas, portions, or components without departing from teachings of the present inventive concept.

Also, relative terms, such as "upper" or "on" and "lower" or "under," may be used to describe a relationship between a component and another component as illustrated in the accompanying drawings. The relative terms may be understood as including directions of a device other than directions illustrated in the accompanying drawings. For example, if a device is turned over in a drawing, a component described as being on an upper surface of another component is shown as being on a lower surface of the other component. Therefore, the exemplary term "on" may include directions indicated by the terms "under" and "on" based on a certain direction in a drawing.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "comprise" and/or "comprising" are intended to indicate the existence of the features, numbers, steps, actions, components, parts, and/or combinations thereof disclosed in the specification, and are not intended to preclude the possibility that one or more other features, numbers, steps, actions, components, parts, and/or combinations thereof may exist and/or may be added.

In the accompanying drawings, the present embodiments may have different forms according to, for example, a manufacturing technology and/or tolerance. Therefore, the embodiments of the present inventive concept should not be construed as being limited to the descriptions set forth herein, but should include, for example modifications created during a manufacturing process. Furthermore, components and areas in the accompanying drawings are schematically illustrated. Therefore, the embodiments of the inventive concept are not limited to sizes and intervals shown in the accompanying drawings. In addition, terms used herein are provided to describe the embodiments of the inventive concept and do not limit the spirit and scope of the inventive concept as defined by the claims.

Figure 1B:
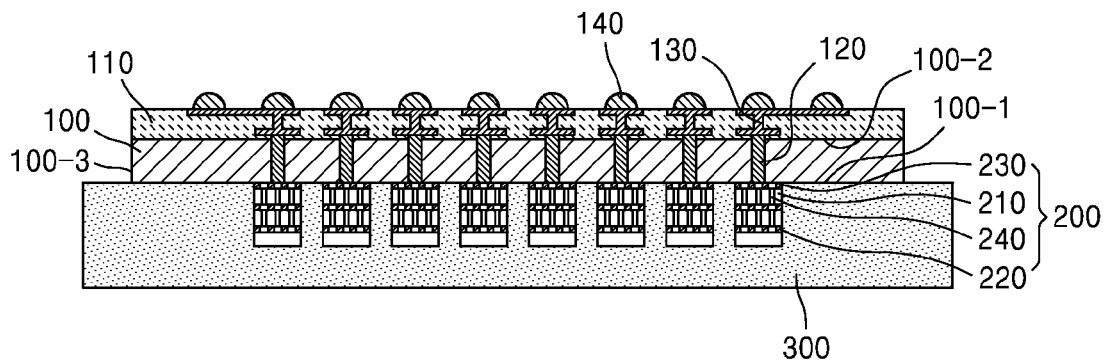
FIG. 1B is a cross-sectional view of FIG. 1A.

FIG. 1A is a schematic perspective view of a 3-dimensional structure of a wafer level semiconductor package 1000 according to an embodiment of the inventive concept. FIG. 1B is a cross-sectional view of the wafer level semiconductor package 1000, taken along a line 1-1' of FIG. 1A.

Referring to FIGS. 1A and 1B, the wafer level semiconductor package 1000 may include a semiconductor wafer substrate 100, a passivation layer 110 formed on a non-active area 100-2 of the semiconductor wafer substrate 100, an external access terminal 140 formed on the passivation layer 110, a plurality of stacked semiconductor chips 200 formed on an active area 100-1 of the semiconductor wafer substrate 100, and a molding element 300 covering a portion of the active area 100-1 and the plurality of stacked semiconductor chips 200. The semiconductor wafer substrate 100 may include a first through electrode 120 from among a plurality of first through electrodes that penetrate through the active area 100-1 and the non-active area 100-2 of the semiconductor wafer substrate 100. The passivation layer 110 may include a lower access pad 130 from among a plurality of lower access pads that is electrically connected to the first through electrode 120.

The semiconductor wafer substrate 100 may include the active area 100-1 in which an integrated circuit (IC) including a semiconductor chip is formed and the non-active area 100-2 in which an IC is not formed. The non-active area 100-2 may be formed in an opposite surface of the active area 100-1. The non-active area 100-2 may be used as a wiring layer. The semiconductor wafer substrate 100 may be a circular plate having a predetermined thickness. The semiconductor wafer substrate 100 may be formed as at least one of a silicon (Si) wafer, a ceramic substrate, a printed circuit board (PCB), an organic substrate, or an interposer substrate. In some embodiments, the semiconductor wafer substrate 100 may be formed as an active wafer. The active wafer refers to a wafer on which a semiconductor chip may be formed, such as a Si wafer. The semiconductor wafer substrate 100 may include a group IV material wafer, such as a Si wafer, or a groups III-V compound wafer.

The semiconductor wafer substrate 100 may include the first through electrode 120, which penetrates through the active area 100-1 and the non-active area 100-2 of the semiconductor wafer substrate 100. According to an embodiment of the inventive concept, if the semiconductor wafer substrate 100 is a Si wafer, the first through electrode 120 may be a through silicon via (TSV). The first through electrode 120 may be formed of, for example, a conductive material. The conductive material may include at least one of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), or zirconium (Zr). The plurality of first through electrodes may include the same or similar conductive material. The first through electrode 120 may be electrically and/or physically connected to one of the plurality of stacked semiconductor chips 200 by being electrically and/or physically connected to the lower access pad 130 and connected to an upper access pad 230. The plurality of first through electrodes may be electrically and/or physically connected to a corresponding one of the plurality of stacked semiconductor chips 200 in similar fashion. Although FIG. 1B illustrates that the first through electrode 120 has a pillar-like form and is connected to a single upper access pad 230 for convenience of description, the first through electrode 120 is not limited thereto. Nor are the first plurality of through electrodes limited thereto. Multiple through electrodes similar to the first through electrode 120 may be formed. Each of the through electrodes may be individually and electrically connected to a corresponding upper access pad similar to the upper access pad 230, as illustrated in FIG. 1B.

The passivation layer 110 may contact the non-active area 100-2 of the semiconductor wafer substrate 100. The passivation layer 110 may surround a side surface of the lower access pad 130 and electrically and/or physically protect the lower access pad 130. The passivation layer 110 may be formed as at least one of a Si oxide layer, a Si nitride layer, or a combination thereof.

The external access terminal 140, which is electrically and/or physically connected to the lower access pad 130, may be formed on the passivation layer 110. The external access terminal 140 may function as an access member that is connected to a PCB or an external device. The external access terminal 140 may be formed by using at least one of a bump, a solder ball, a pin grid array, a ball grid array, or a micro pillar grid array (MPGA).

The plurality of stacked semiconductor chips 200 may be formed on the active area 100-1 of the semiconductor wafer substrate 100. The plurality of stacked semiconductor chips 200 may include a first semiconductor chip 210, a first passivation layer 220, the upper access pad 230, and a second through electrode 240. The first semiconductor chip 210 may be formed based on an active wafer or an interposer substrate. The first semiconductor chip 210 may be formed as at least one of a Si substrate, a ceramic substrate, a PCB, an organic substrate, or an interposer substrate. The first semiconductor chip 210 may include a group IV material wafer, such as a Si wafer, or a groups III-V compound wafer. According to an embodiment of the inventive concept, the first semiconductor chip 210 may be a semiconductor memory device. The first semiconductor chip 210 may be, for example, at least one of dynamic random access memory (DRAM), static RAM (SRAM), a flash memory, electrically erasable programmable read-only memory (EEPROM), phase-change RAM (PRAM), magnetoresistive RAM (MRAM), or resistive RAM (RRAM).

The first passivation layer 220 may be formed under the semiconductor chip 210, and protects the first semiconductor chip 210 from the outside. The first passivation layer 220 may be formed as an oxide layer or a nitride layer, or a double layer formed of an oxide layer and a nitride layer. The upper access pad 230 may contact the first semiconductor chip 210 that is nearest to the active area 100-1 and may be formed by using a conductive material.

The second through electrode 240 may pass through the first semiconductor chip 210 and be connected to the upper access pad 230. Similarly, the second plurality of through electrodes may each pass through a corresponding one of the plurality of semiconductor chips. According to an embodiment of the inventive concept, the second through electrode 240 may be formed of a TSV. The second through electrode 240 may include a barrier metal layer and a wiring metal layer. The second through electrode 240 and the first through electrode 120 may be formed by using the same material, but are not limited thereto. Similarly, the second plurality of through electrodes and the first plurality of through electrodes may be formed by using the same material, but are not limited thereto.

The molding element 300 may be formed to cover the active area 100-1. The molding element 300 may be formed to cover an upper surface and/or a side surface of the plurality of stacked semiconductor chips 200. The molding element 300 may be formed to encapsulate the plurality of stacked semiconductor chips 200, and thus, the plurality of stacked semiconductor chips 200 may be protected from the outside. The molding element 300 may include a material with excellent strength and high modulus. For example, the molding element 300 may be formed of an epoxy-based material, a thermosetting material, a thermoplastic material, and/or a UV processing material, or the like. A diameter 300R of the molding element 300 may be greater than a diameter 100R of the semiconductor wafer substrate 100.

The wafer level semiconductor package 1000 according to an inventive concept may be a chip-on-wafer (COW) in which the plurality of stacked semiconductor chips 200 are integrally formed on the semiconductor wafer substrate 100. The wafer level semiconductor package 1000 may have a structure, which may improve a handling property at a wafer level and increase reliability. When a semiconductor package is manufactured in a COW structure, if the diameter 300R of the molding element 300 is less than the diameter 100R of the semiconductor wafer substrate 100, the semiconductor wafer substrate 100 is not completely covered by the molding element 300. Accordingly, a portion of the active area 100-1 proximate to an edge 100-3 of the semiconductor wafer substrate 100 would be exposed, and thus a substrate overhang would be created. Due to the substrate overhang, the edge of the semiconductor wafer substrate 100 may be damaged or cracks may otherwise occur therein. In the wafer level semiconductor package 1000 according to an inventive concept, the plurality of stacked semiconductor chips 200 are protected because the diameter 300R of the molding element 300 is greater than the diameter 100R of the semiconductor wafer substrate 100. In addition, a substrate overhang relative to the molding element 300 is not created because the active area 100-1 proximate to the edge 100-3 of the semiconductor wafer substrate 100 is not exposed. Therefore, the semiconductor wafer substrate 100 may be prevented from being damaged or having cracks during processes of manufacturing the wafer level semiconductor package 1000, as a result of moving a carrier, storing in a cassette, epoxy molding, or the like.

FIGS. 2A to 14A are perspective views of the wafer level semiconductor package 1000 at various stages of manufacturer, according to an embodiment of the inventive concept. FIGS. 2B to 14B are cross-sectional views taken along lines 1-1' to 14-14' in FIGS. 2A to 14A, respectively, of the wafer level semiconductor package 1000 at various stages of manufacture. For example, FIG. 2B is a cross-sectional view of FIG. 2A taken along a line 2-2'. FIG. 8C is an enlarged sectional view of one of the plurality of stacked semiconductor chip 200. FIGS. 2A to 14A illustrate a method of manufacturing the wafer level semiconductor package 1000 at a wafer level. A manufacturing process at a wafer level includes directly mounting a semiconductor chip on a wafer, performing a trimming process, and/or performing a grinding process in a wafer state. The manufacturing process may include cutting a wafer into individual base chips or individual chips and/or rearranging the individual base chips or individual chips on a wafer-sized support substrate.

Figure 2A:
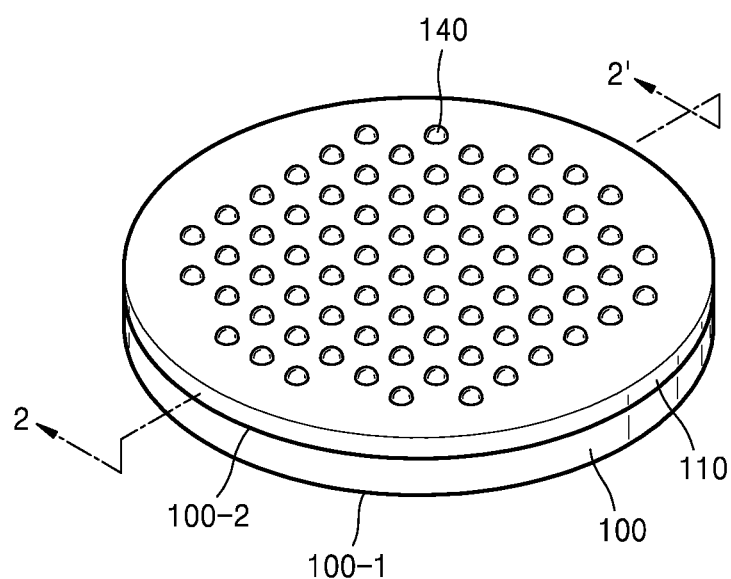
Figure 2B:
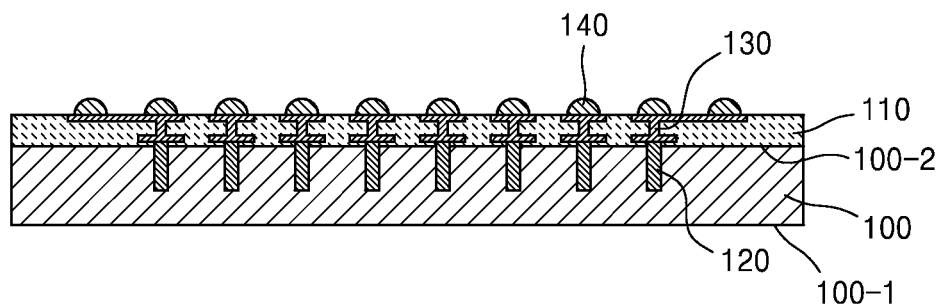

Referring to FIGS. 2A and 2B, the first through electrode 120 is formed from the non-active area 100-2 of the semiconductor wafer substrate 100 toward the active area 100-1 of the semiconductor wafer substrate 100, the lower access pad 130 that is connected to the first through electrode 120, the passivation layer 110 that is formed on the non-active area 100-2, and the external access terminal 140 130 that is connected to the lower access pad. Each of the first plurality of through electrodes may be formed in a similar fashion.

The semiconductor wafer substrate 100 may be formed based on an active wafer or an interposer substrate. The active wafer refers to a wafer on which a semiconductor chip may be formed, such as a Si wafer. The semiconductor wafer substrate 100 may include a group IV material wafer, such as a Si wafer, or a groups III-V compound wafer. Also, the semiconductor wafer substrate 100 may be formed by using a monocrystal wafer, such as a Si monocrystal wafer. However, the semiconductor wafer substrate 100 is not limited to a monocrystal wafer, and may be formed by using an epitaxial wafer, a polished wafer, an annealed wafer, and/or a silicon-on-insulator (SOI) wafer, or the like. The epitaxial wafer refers to a wafer in which a crystalline material is grown on a monocrystal Si substrate.

According to an embodiment of the inventive concept, the semiconductor wafer substrate 100 may include a logic semiconductor chip. The semiconductor wafer substrate 100 may include a micro-processor, for example, a central processing unit (CPU), a controller, or an application specific integrated circuit (ASIC). In some embodiments, the semiconductor wafer substrate 100 may include an application processor (AP) that is used in mobile phones or smart phones.

The first through electrode 120 may be formed by etching a portion of the non-active area 100-2 of the semiconductor wafer substrate 100 without completely passing through the semiconductor wafer substrate 100. According to an embodiment of the inventive concept, the semiconductor wafer substrate 100 may be a Si wafer substrate, and in this case, the first through electrode 120 may be a TSV. The TSV may include, for example, a conductive material. The conductive material may include at least one of Al, Au, Be, Bi, Co, Cu, Hf, In, Mn, Mo, Ni, Pb, Pd, Pt, Rh, Re, Ru, Ta, Te, Ti, W, Zn, or Zr. The first plurality of through electrodes may be formed in a similar fashion.

The lower access pad 130 may be formed to be electrically and/or physically connected to the first through electrode 120. Similarly, each of the plurality of lower access pads may be formed to be electrically and/or physically connected to a corresponding one of the first plurality of through electrodes. The lower access pad 130 may be formed by using a conductive material. The lower access pad 130 may be formed of Al or Cu, and may be formed by using a pulse plating method or a direct current (DC) plating method. However, a material and a method of forming the lower access pad 130 are not limited thereto. The plurality of lower access pads may be formed in a similar fashion.

The passivation layer 110 may surround the lower access pad 130 and cover an upper surface of the non-active area 100-2 of the semiconductor wafer substrate 100. The passivation layer 110 protects the semiconductor wafer substrate 100 from the outside. The passivation layer 110 may be formed as an oxide layer, a nitride layer, or a double layer formed of an oxide layer and a nitride layer. Alternatively, by using a high density plasma chemical vapor deposition (HDP-CVD) method, the passivation layer 110 may be formed as an oxide layer or a nitride layer. For example, the passivation layer 110 may be formed as a silicon oxide ($SiO_2$) layer or a silicon nitride ($SiN_x$) layer.

The external access terminal 140 may be formed on the passivation layer 110. The external access terminal 140 may mount the wafer level semiconductor package 1000 entirely on an external system substrate or an external main board. The external access terminal 140 may be formed by using a conductive material. For example, the conductive material may include at least one of Cu, Al, Ag, tin (Sn), Au, or a solder. However, a material of the external access terminal 140 is not limited thereto. The external access terminal 140 may be formed as multiple layers or a single layer.

Figure 3A:
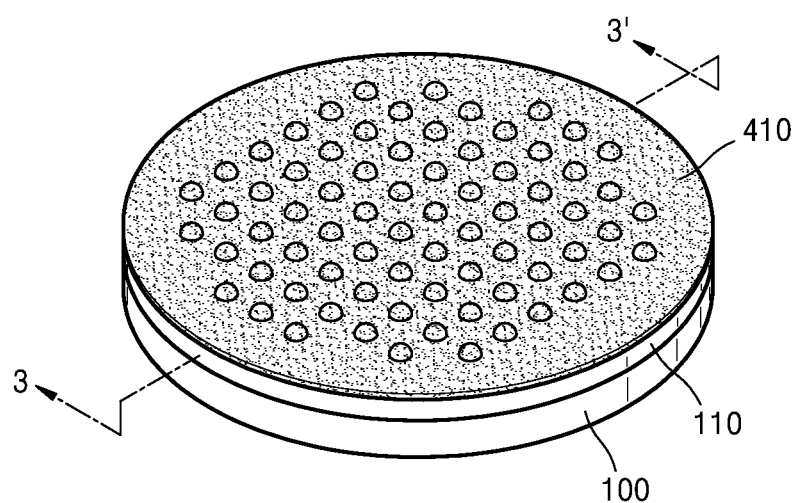
Figure 3B:
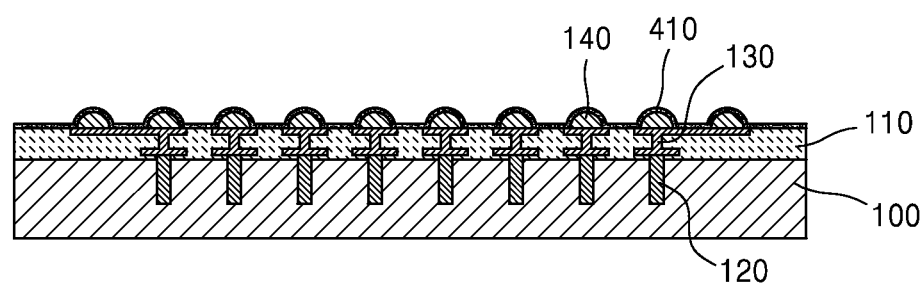

Referring to FIGS. 3A and 3B, a release layer 410 may cover an upper surface of the passivation layer 110 and an upper surface of the external access terminal 140.

Figure 13A:
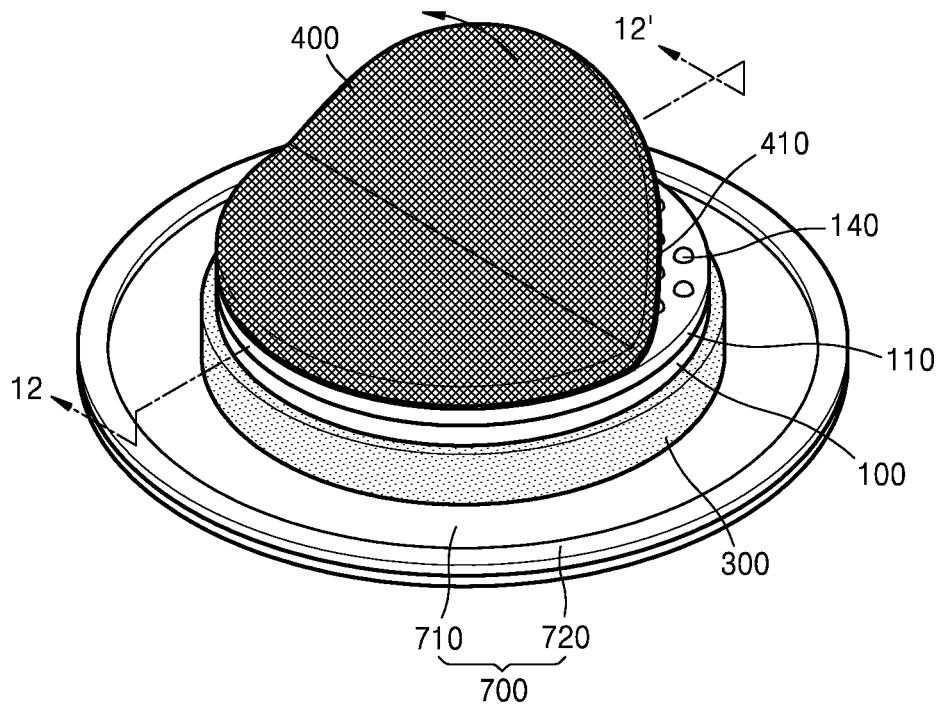
Figure 13B:
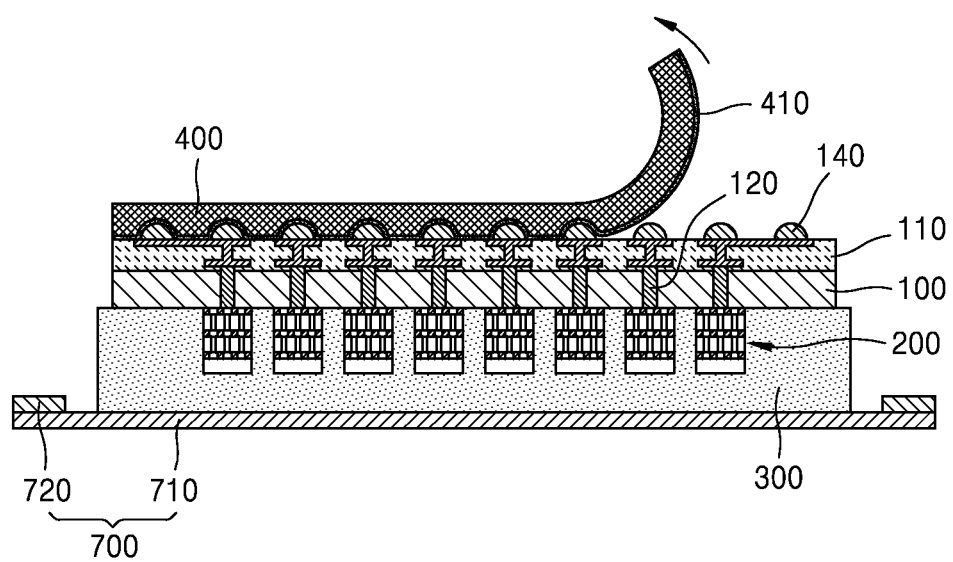

The release layer 410 is formed to conveniently remove a protection layer 400 (refer to FIGS. 13A and 13B and descriptions regarding FIGS. 13A and 13B). The release layer 410 may be formed by using a material having a low adhesion strength with respect to the passivation layer 110 and the access terminal 140. For example, the release layer 410 may be formed of a polymer material or an ultraviolet (UV) film. A thickness of the release layer 410 may be less than that of the passivation layer 110. The release layer 410 may be formed such that an area including the external access terminal 140 protrudes.

Figure 4A:
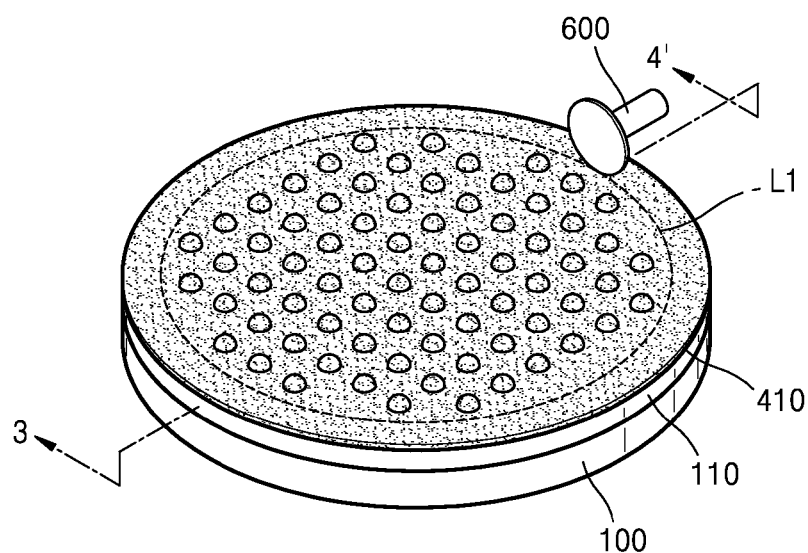
Figure 4B:
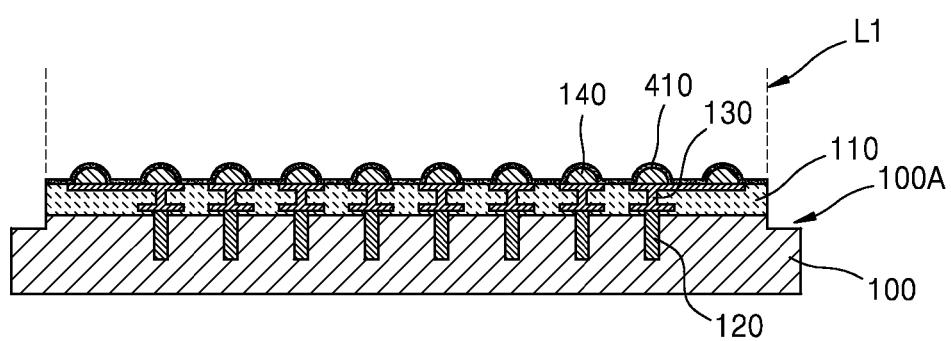

Referring to FIGS. 4A and 4B, respective edges of the release layer 410, the passivation layer 110, and the semiconductor wafer substrate 100 may be trimmed along a cutting line L1. The edge trimming process may be performed by using a blade 600 while rotating the semiconductor wafer substrate 100. By performing the edge trimming process, the respective edges of the release layer 410 and the passivation layer 110 are cut and an upper portion of the edge of the semiconductor wafer substrate 100 is trimmed by a predetermined thickness. Therefore, an upper diameter and a lower diameter of the semiconductor wafer substrate 100 may differ, and thus, a trimmed wafer substrate surface 100A may be formed.

After the edge trimming process, a cleaning process may be performed by dipping the semiconductor wafer substrate 100, the passivation layer 110, and the release layer 410 in a cleaning apparatus having a cleaning solution therein. The cleaning process is performed because there may be debris of the semiconductor wafer substrate 100, the passivation layer 110, and the release layer 410 due to the edge trimming process.

Figure 5A:
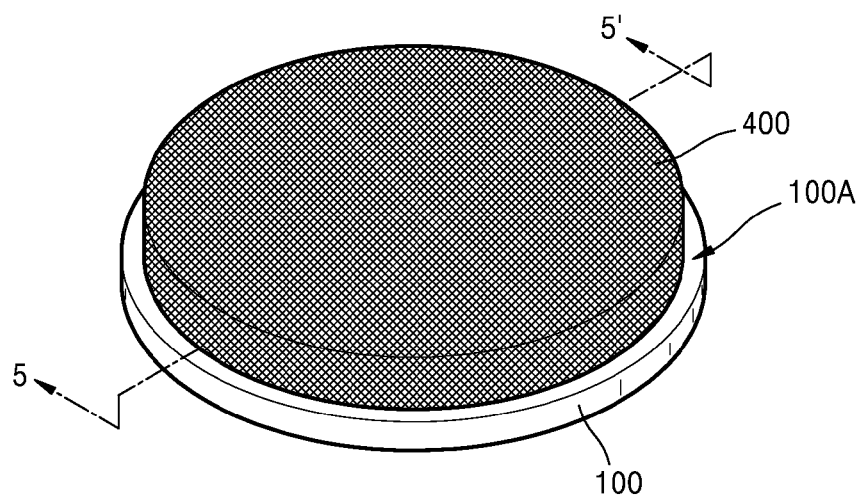
Figure 5B:
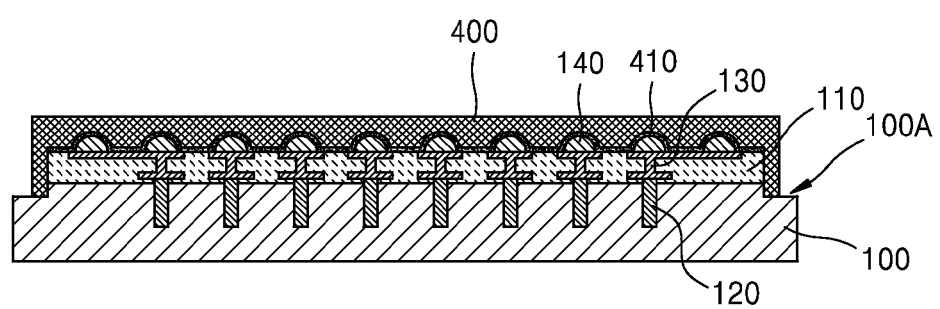

Referring to FIGS. 5A and 5B, the protection layer 400 may cover an upper surface of the release layer 410, an upper surface and a side surface of the passivation layer 110, and a first portion of the trimmed wafer substrate surface 100A such that a second portion of the trimmed wafer substrate surface 100A is exposed. The protection layer 400 may encapsulate the release layer 410, the passivation layer 110, and the external access terminal 140, but does not completely encapsulate the semiconductor wafer substrate 100. The protection layer 400 increases the thermal resistance of the wafer level semiconductor package 1000, and may protect the semiconductor wafer substrate 100 from the outside in subsequent processes. The protection layer 400 may be formed of a material with excellent strength, high thermal resistance, and high modulus so as to protect the semiconductor wafer substrate 100 as described above. For example, the protection layer 400 may be formed of an epoxy-based material, a thermosetting material, a thermoplastic material, a UV processing material, and the like. The thermosetting material may include a phenol-type, an acid anhydride-type, or an amine-type hardening agent, or an acryl-polymer additive. According to an embodiment of the inventive concept, the protection layer 400 may be formed of an epoxy molding compound (EMC). The protection layer 400 may be formed by filling a liquid EMC into a mold and solidifying the filled liquid EMC, by laminating and solidifying a film-type resin, or by spraying and solidifying a resin.

Figure 6A:
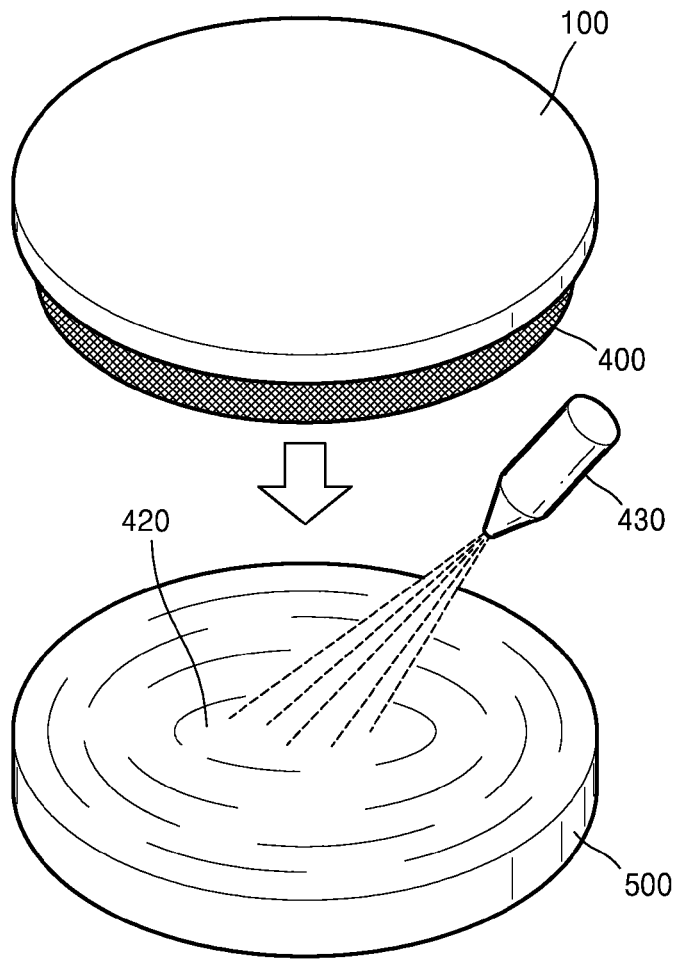

Referring to FIG. 6A, an adhesive layer 420 may be formed on a wafer carrier 500. Then, the semiconductor wafer substrate 100, on which the protection layer 400 is formed, may be turned over, and the upper surface of the protection layer 400 may be attached to the adhesive layer 420. The adhesive layer 420 may be formed to a cover a side surface of the trimmed edge of the wafer substrate 100, and to cover the second portion of the trimmed wafer substrate surface 100A.

Figure 8A:
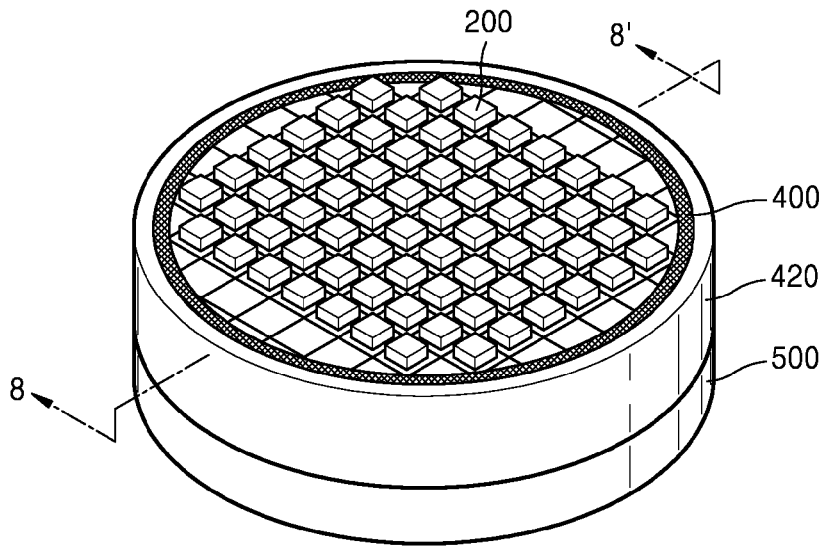
Figure 8B:
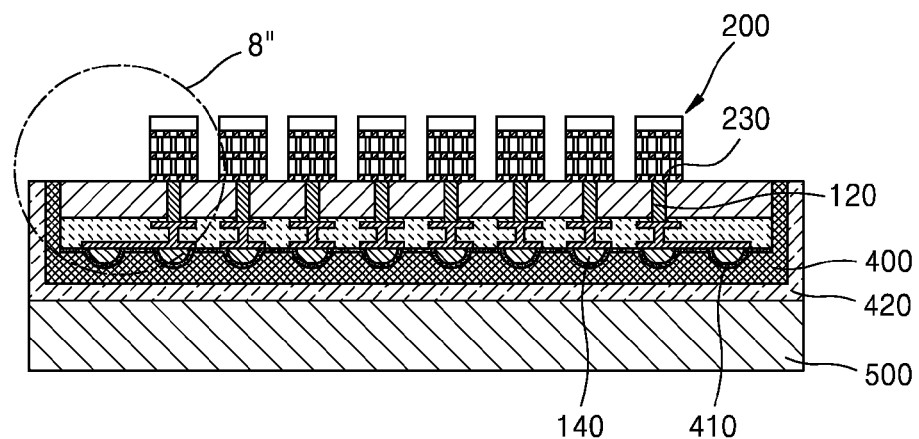
Figure 9A:
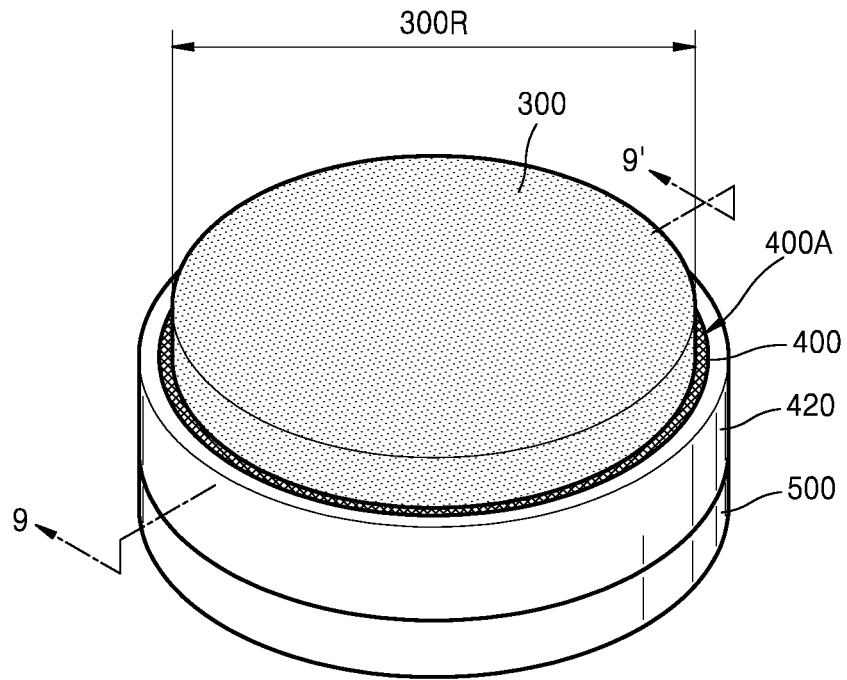
Figure 9B:
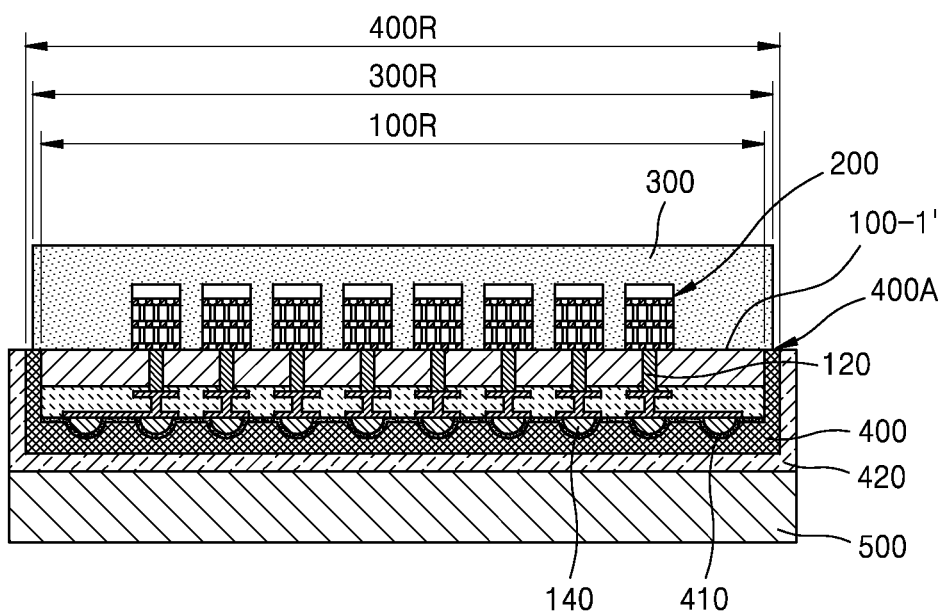

The wafer carrier 500 may be a temporary carrier that is used to conveniently perform a process of grinding the active area 100-1 of the semiconductor wafer substrate 100 (refer to FIGS. 7A and 7B), a process of stacking semiconductor chips (refer to FIGS. 8A and 8B), and a process of forming the molding element 300 (refer to FIGS. 9A and 9B). A material used to form the wafer carrier 500 may be the same as that of the semiconductor wafer substrate 100, but is not limited thereto. For example, the material used to form the wafer carrier 500 may include sapphire and/or glass.

The adhesive layer 420 may be formed by spraying an adhesive element on an upper surface of the wafer carrier 500 by using an adhesive spraying apparatus 430 according to a spin coating method. The adhesive layer 420 may be formed by using, for example, an adhesive element including polymer and/or resin. The adhesive layer 420 may be formed by using a thermal bonding method in which the adhesive element is heated to a high temperature and cured. After spin coating the adhesive element, the semiconductor wafer substrate 100, on which the protection layer 400 is formed, may be turned over such that an upper surface 400-1 of the protection layer 400 faces the adhesive layer 420, and then, is attached to the adhesive layer 420. Since the semiconductor wafer substrate 100 is turned upside down in the above-described attaching process, the active area 100-1 faces upward and the upper surface 400-1 of the protection layer 400 faces downward.

Figure 6B:
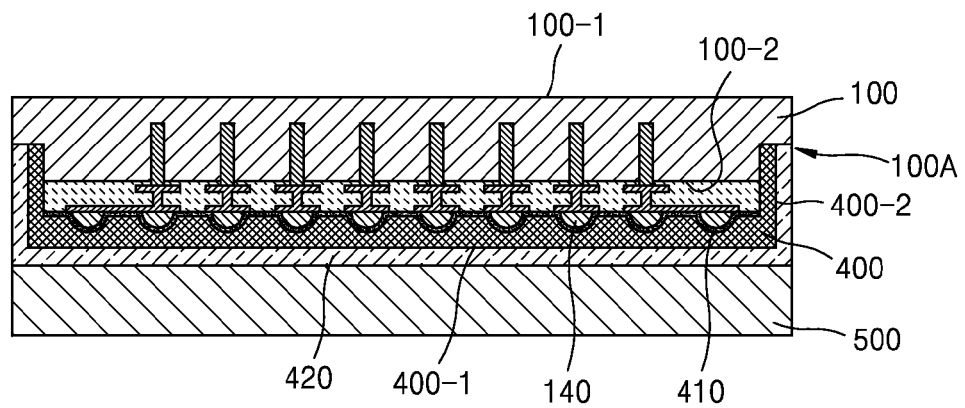

FIG. 6B is a cross-sectional view of a result of attaching the semiconductor wafer substrate 100 and the protection layer 400 on the wafer carrier 500 through the process described with reference to FIG. 6A. Referring to FIG. 6B, the adhesive layer 420 covers both the upper surface 400-1 and a side surface 400-2 of the protection layer 400 and the trimmed wafer substrate surface 100A. Since the adhesive layer 420 is formed by using a spin coating method, the adhesive layer 420 may be formed in a circular plate shape that is substantially the same as a shape of the wafer carrier 500. A diameter of the adhesive layer 420 may be greater than a diameter of the protection layer 400.

Figure 7A:
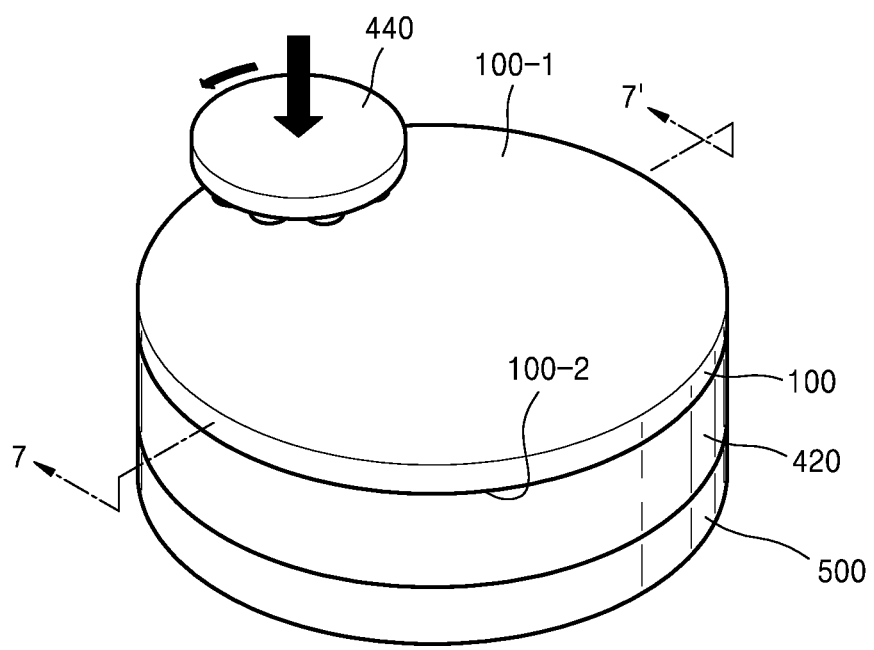
Figure 7B:
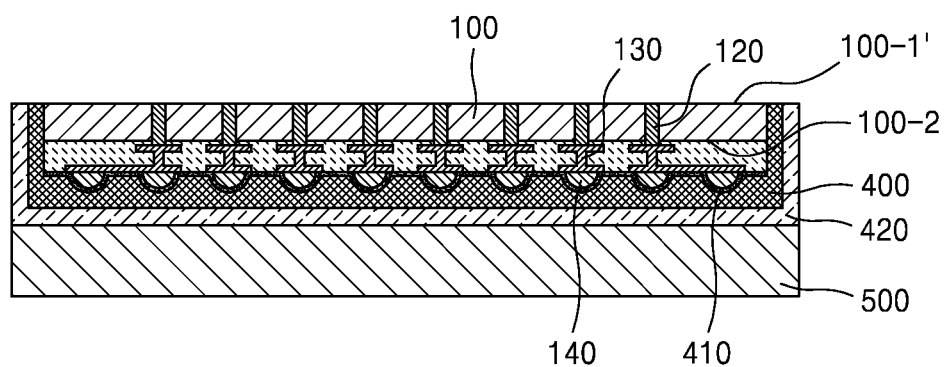

Referring to FIGS. 7A and 7B, the active area 100-1 of the semiconductor wafer substrate 100 may be ground using a grinder 440 until an upper surface of the first through electrode 120, and the first plurality of through electrodes, are exposed. By grinding the active area 100-1 using the grinder 440, the trimmed wafer substrate surface 100A is removed and a diameter of the semiconductor wafer substrate 100 becomes less than the diameter of the protection layer 400 and the diameter of the adhesive layer 420. An active area 100-1' of the semiconductor wafer substrate 100 after the above-described grinding process may be flush with the upper surface of the protection layer 400 and an upper surface of the adhesive layer 420.

Figure 8C:
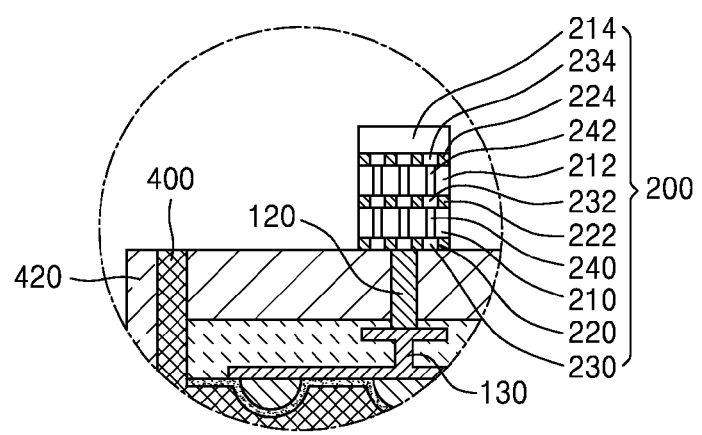
FIG. 8C is an enlarged sectional view of one of the plurality of stacked semiconductor chips 200.

Referring to FIGS. 8A and 8B, the plurality of stacked semiconductor chips 200 may be formed on the active area 100-1 of the semiconductor wafer substrate 100. The plurality of stacked semiconductor chips 200 may each be electrically and/or physically connected to a corresponding through electrode (e.g., first through electrode 120). Each of the through electrodes (e.g., first through electrode 120) may be connected to a corresponding lower access pad (e.g., lower access pad 130). The plurality of stacked semiconductor chips 200 may be connected to an external system substrate or an external main board via external access terminals (e.g., external access terminal 140). Although FIG. 8B, which is a cross-sectional view taken along a line 8-8' of FIG. 8A, illustrates 8 stacked semiconductor chips 200 for convenience of description, the number of plurality of stacked semiconductor chips 200 is not limited thereto.

FIG. 8C is an enlarged view of a portion 8'' of FIG. 8B, which shows a cross-sectional view of a detailed structure of one of the plurality of stacked semiconductor chips 200.

Referring to FIG. 8C, the plurality of stacked semiconductor chips 200 may include for example, a first semiconductor chip 210, a second semiconductor chip 212, and a third semiconductor chip 214. The plurality of stacked semiconductor chips 200 may include a plurality of passivation layers. The plurality of passivation layers may include, for example, a first passivation layer 220, a second passivation layer 222, and a third passivation layer 224. The plurality of stacked semiconductor chips 200 may include access pads. The access pads may include, for example, the upper access pad 230, a first interlayer access pad 232, and a second interlayer access pad 234. The plurality of stacked semiconductor chips 200 may include a second through electrode 240 and a third through electrode 242. Although FIGS. 8B and 8C illustrate three stacked semiconductor chips and three passivation layers, more or fewer semiconductor chips and passivation layers may be stacked.

The plurality of semiconductor chips formed as the first to third semiconductor chips 210, 212, and 214 may be formed based on an active wafer or an interposer substrate. Materials, shapes, and forming methods of the first to third semiconductor chips 210, 212, and 214 may be the same as those of the semiconductor wafer substrate 100, but are not limited thereto. The first to third semiconductor chips 210, 212, and 214 may be semiconductor memory devices. The first to third semiconductor chips 210, 212, and 214 may be, for example, at least one of DRAM, SRAM, a flash memory, EEPROM, PRAM, MRAM, and RRAM. The first to third semiconductor chips 210, 212, and 214 may be formed such that respective flat areas thereof are the same. The first to third semiconductor chips 210, 212, and 214 and the semiconductor wafer substrate 100 may be different types of semiconductor chips performing different functions. As described above, the semiconductor wafer substrate 100 according to an embodiment of the inventive concept may be a logic semiconductor chip (refer to descriptions of FIGS. 2A and 2B), and the first to third semiconductor chips 210, 212, and 214 may be memory semiconductor chips. However, this is only an example and the embodiments of the inventive concept are not limited thereto.

The first to third passivation layers 220, 222, and 224 are formed under the first to third semiconductor chips 210, 212, and 214, respectively, and may protect the first to third semiconductor chips 210, 212, and 214 from the outside. The first to third passivation layers 220, 222, and 224 may be may be formed as oxide layers or nitride layers, or double layers formed of oxide layers and nitride layers. Alternatively, by using an HDP-CVD method, the first to third passivation layers 220, 222, and 224 may be formed as oxide layers or nitride layers, for example, silicon oxide ($SiO_2$) layers or silicon nitride ($SiN_x$) layers.

The upper access pad 230 may be formed by using a conductive material on a lower surface of the first semiconductor chip 210, and may be electrically and/or physically connected to the first through electrode 120 via the first passivation layer 220. Similarly, the plurality of upper access pads may be formed by using a conductive material on a lower surface of the first semiconductor chip 210, and may be electrically and/or physically connected to the first plurality of through electrodes via the first passivation layer 220. The upper access pad 230 may be formed of Al or Cu, and may be formed by using a pulse plating method or a DC plating method. However, a material and a method of forming the upper access pad 230 are not limited thereto. The first and second interlayer access pads 232 and 234 may penetrate through the second and third passivation layers 222 and 224, respectively, and may be electrically and/or physically connected to the second through electrode 240 and to the third through electrode 242, respectively. Materials and a method of forming the first and second interlayer access pads 232 and 234 may be the same as those of the upper access pad 230.

The second through electrode 240 and the third through electrode 242 may penetrate through the first and second semiconductor chips 210 and 212, respectively, and thus be electrically and/or physically connected to the first and second interlayer access pads 232 and 234, respectively. Although FIG. 8C illustrates three sub-electrodes as part of the second through electrode 240 and three sub-electrodes as part of the third through electrode 242, more or fewer sub-electrodes may be included. The second through electrode 240 and the third through electrode 242 may each include barrier metal layers and wiring metal layers. The barrier metal layers may include a stacked structure formed of at least one of Ti, Ta, titanium nitride (TiN), or tantalum nitride (TaN). The wiring metal layers may include at least one of Al, Au, Be, Bi, Co, Cu, Hf, In, Mn, Mo, Ni, Pb, Pd, Pt, Rh, Re, Ru, Ta, Te, Ti, W, Zn, or Zr. For example, the wiring metal layer may include a stacked structure formed of at least one of W, Al, or Cu. However, materials of the second through electrode 240 and the third through electrode 242 are not limited thereto. The second plurality of through electrodes and the third plurality of through electrodes may be formed of the same or similar materials.

Referring to FIGS. 9A and 9B, the molding element 300 may be formed such that a ground upper surface of the active area 100-1' of the semiconductor wafer substrate 100 and a portion of a ground upper surface of the protection layer 400 are covered, and upper surfaces and side surfaces of the plurality of stacked semiconductor chips 200 are surrounded.

The molding element 300 may encapsulate the plurality of semiconductor chips 210. The diameter 300R of the molding element 300 may be greater than the diameter 100R of the semiconductor wafer substrate 100 and less than a diameter 400R of the protection layer 400. Since the diameter 300R of the molding element 300 is less than the diameter 400R of the protection layer 400, a protection layer overhang 400A may be formed. That is, the upper surface of the protection layer 400 is not completely covered by the molding element 300. The protection layer overhang 400A may protect an edge of the semiconductor wafer substrate 100 from being damaged or cracking while being attached to a dicing tape (refer to FIGS. 10A and 10B), moved, molded, or peeled.

The molding element 300 may be formed of, for example, an epoxy-based material, a thermosetting material, a thermoplastic material, or a UV processing material. According to an embodiment of the inventive concept, the molding element 300 may be formed by using an EMC. The molding element 300 may be formed by permeating a liquid EMC into a mold and solidifying, or by laminating and solidifying a film-type resin. Alternatively, the molding element 300 may be formed by using a molded underfill (MUF) method.

Figure 10A:
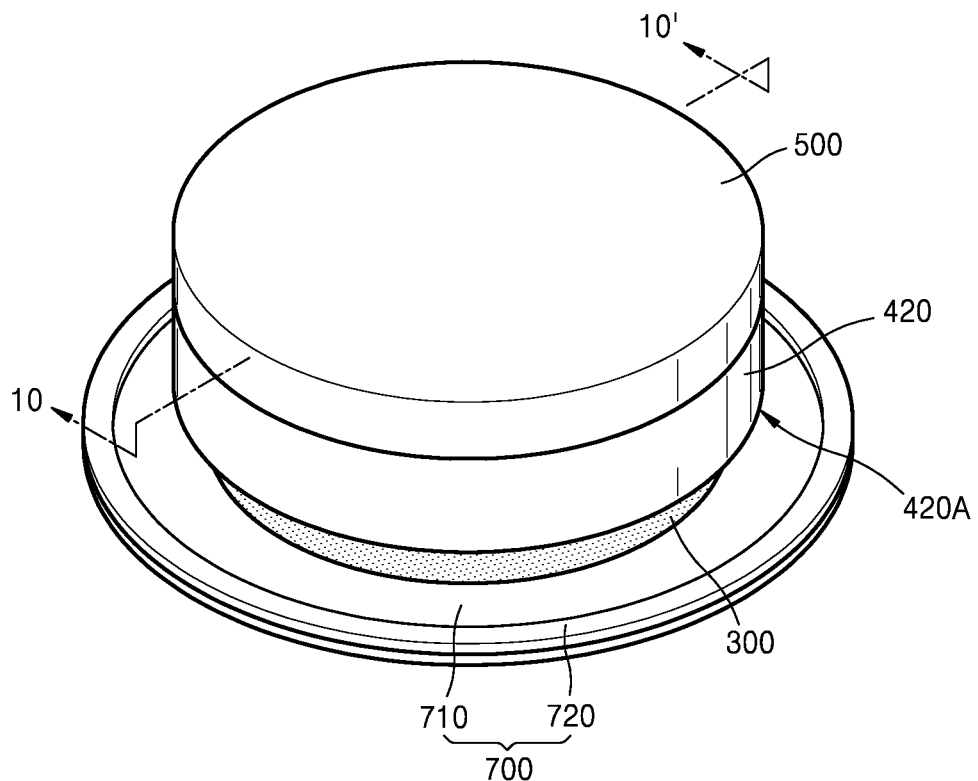
Figure 10B:
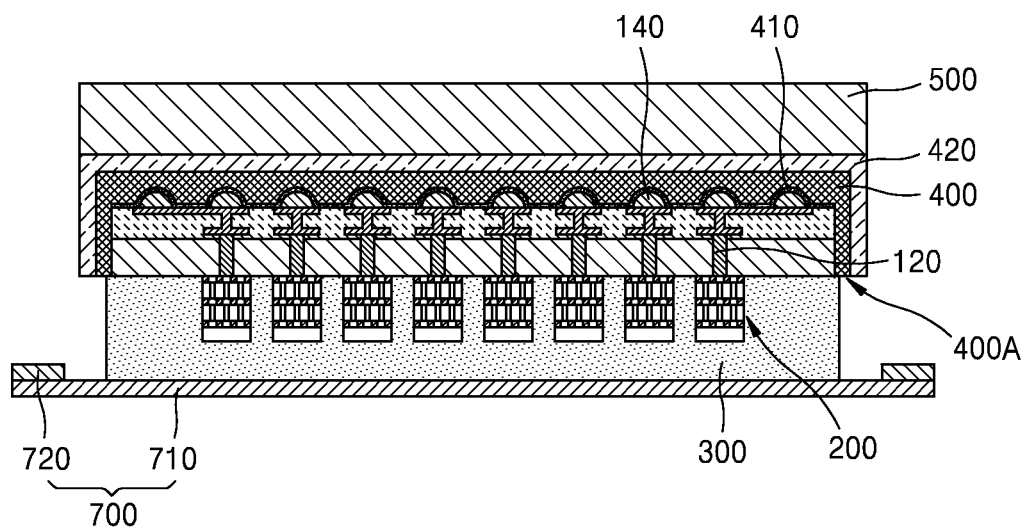

Referring to FIGS. 10A and 10B, the semiconductor wafer substrate 100, on which the protection layer 400 and the adhesive layer 420 are formed, and a wafer structure formed of the plurality of stacked semiconductor chips 200 and the molding element 300 may be turned over and attached to a dicing tape structure 700. The wafer structure may be attached to the dicing tape structure 700 so as to conveniently perform subsequent processes of removing the adhesive layer 420 (refer to FIGS. 11A and 11B), trimming the respective edges of the protection layer 400 and the semiconductor wafer substrate 100 (refer to FIGS. 12A and 12B), peeling the protection layer 400 (refer to FIGS. 13A and 13B), and a singulation process (refer to FIGS. 14A and 14B). The dicing tape structure 700 may include a dicing tape 710 and a frame 720.

Figure 11A:
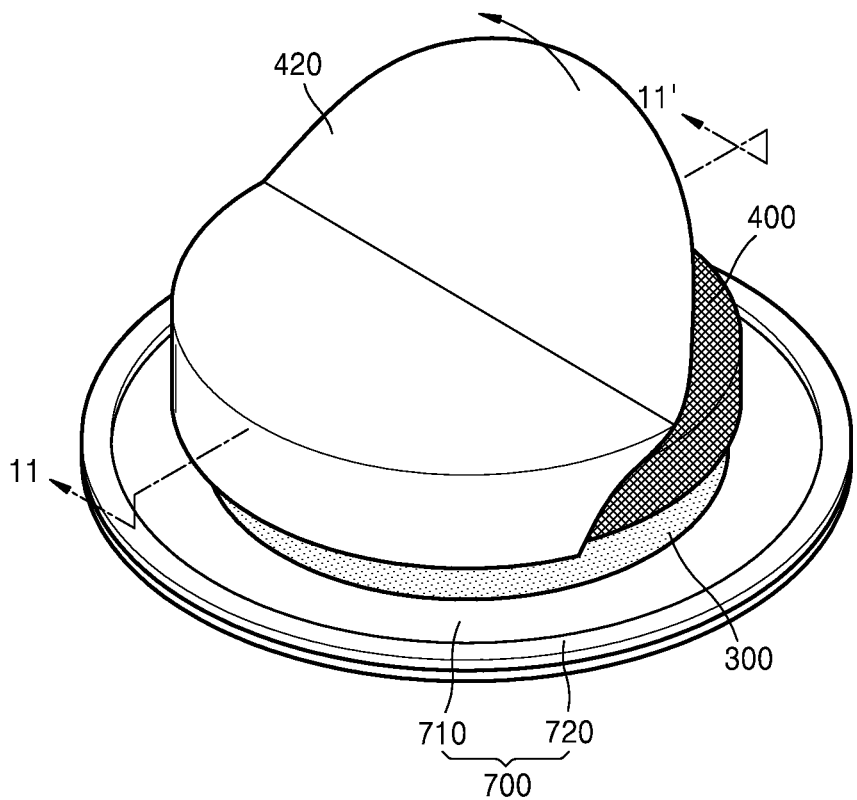
Figure 11B:
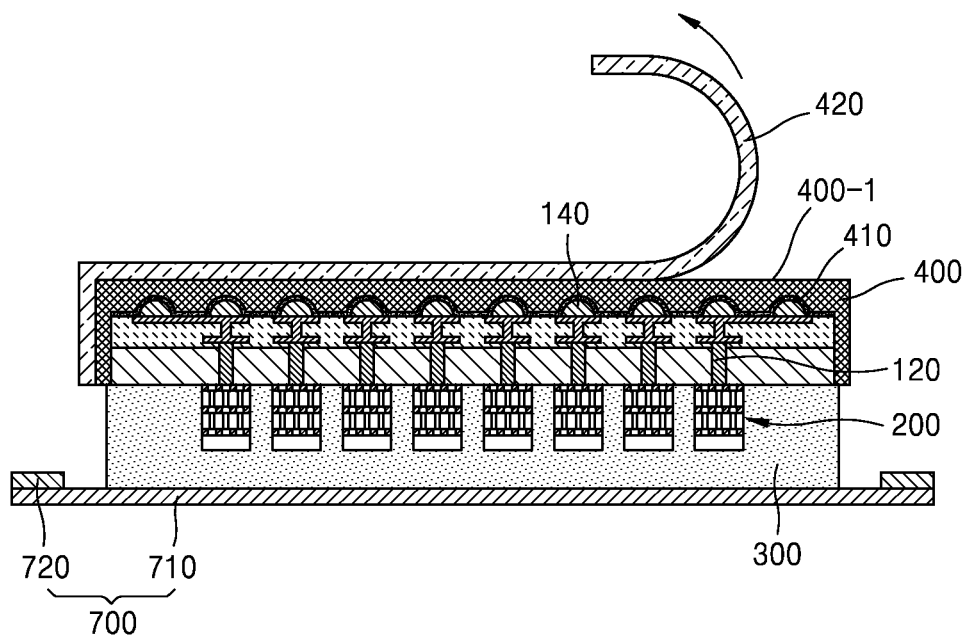

Referring to FIGS. 11A and 11B, the adhesive layer 420 and the wafer carrier 500, which are formed on the upper surface 400-1 of the protection layer 400, may be removed. The wafer carrier 500 may be removed first, and then, the adhesive layer 420 may be removed. According to an embodiment of the inventive concept, a laser may be emitted on the adhesive layer 420. For example, the laser may be a yttrium aluminum garnet (YAG) laser.

Figure 12A:
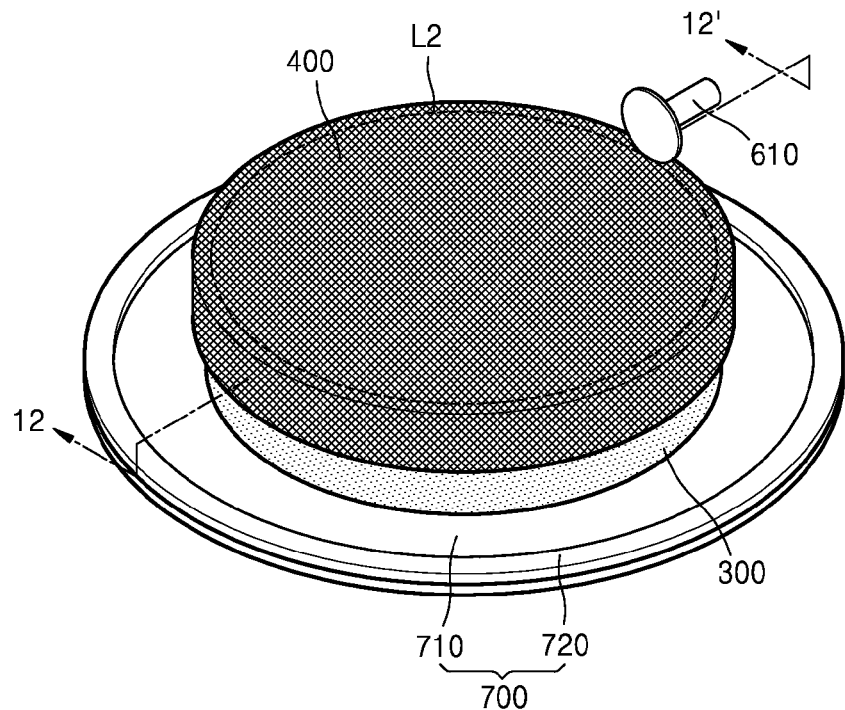
Figure 12B:
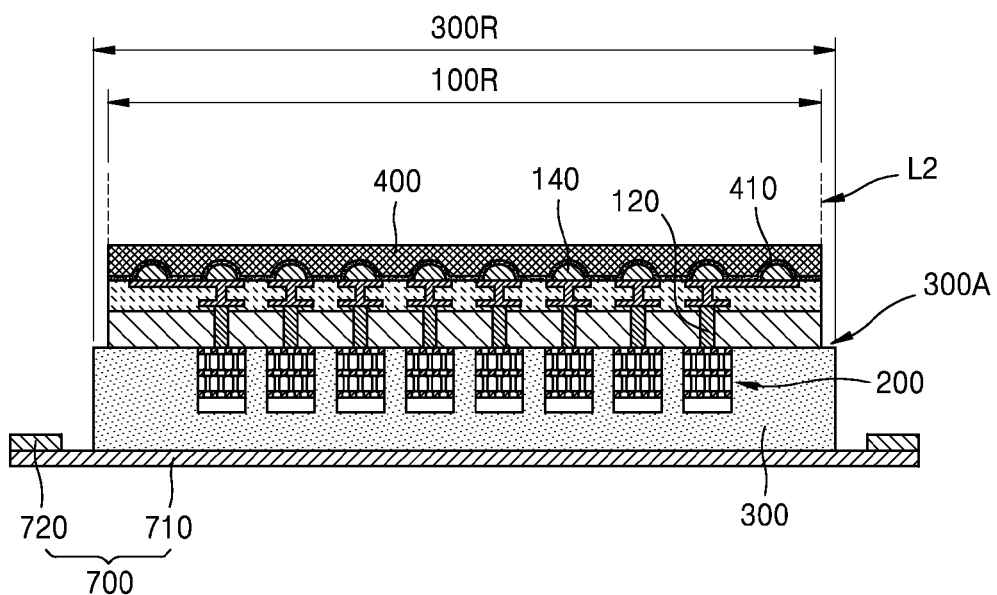

Referring to FIGS. 12A and 12B, the respective edges of the protection layer 400, the passivation layer 110, and the semiconductor wafer substrate 100 may be trimmed along a cutting line L2.

When the edge trimming process is performed along the cutting line L2 by using a blade 610, a diameter 100R of the protection layer 400, the passivation layer 110, and the semiconductor wafer substrate 100 becomes less than the diameter 300R of the molding element 300, and thus, a molding element overhang 300A may be formed. Since the diameter 300R of the molding element 300 is greater than the diameter 100R of the semiconductor wafer substrate 100, the edge of the semiconductor wafer substrate 100 may be prevented from being damaged or cracked during the process of removing the protection layer 400 (refer to FIGS. 13A and 13B) and the singulation process (refer to FIGS. 14A and 14B).

Referring to FIGS. 13A and 13B, a peeling process of removing the release layer 410 and the protection layer 400, which are formed on the passivation layer 110 and the external access terminal 140, may be performed. According to an embodiment of the inventive concept, since the release layer 410 may be formed of a polymer material that has small adhesion strength with respect to the passivation layer 110, the protection layer 400 may be easily removed by removing the release layer 410.

Figure 14A:
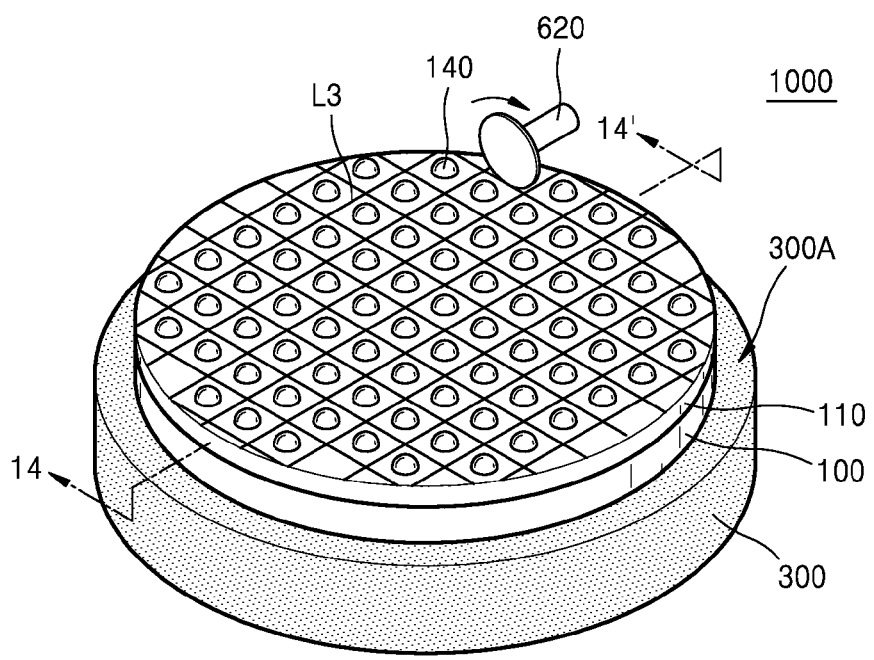
Figure 14B:
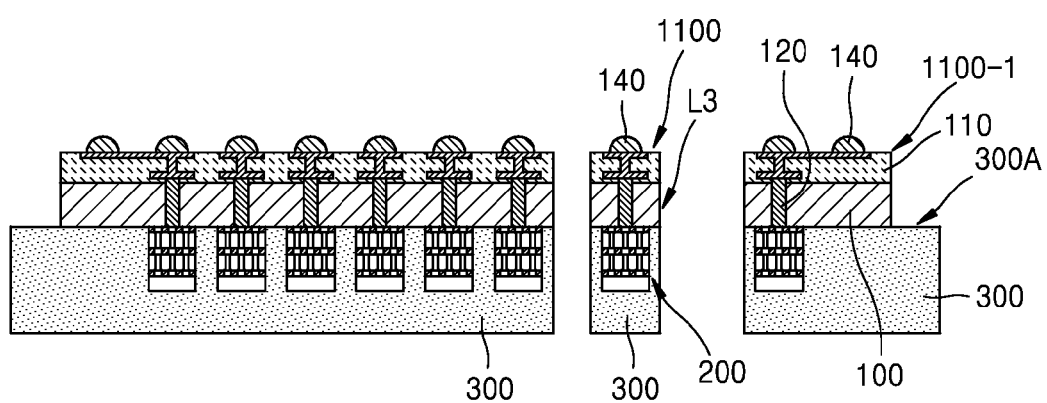

Referring to FIGS. 14A and 14B, a singulation process is performed to form an individual semiconductor package 1100 by dicing the passivation layer 110, the semiconductor wafer substrate 100, and the molding element 300 along a cutting line L3 by using a blade 620.

The cutting line L3 may be formed to include one of the plurality of stacked semiconductor chips 200. When cut along the cutting line L3, the semiconductor wafer substrate 100, the passivation layer 110, and the molding element 300 of the individual semiconductor package 1100 may have the same flat areas. However, with respect to an individual semiconductor package 1100-1, which is formed at a peripheral area of the wafer level semiconductor package 1000, a flat area of the molding element 300 may be greater than that of the semiconductor wafer substrate 100 and the passivation layer 110, and there may still be the molding element overhang 300A. Although FIG. 14B illustrates that only a single lower access pad 130 and a single external access terminal 140 are formed in each of the individual semiconductor packages 1100 and 1100-1, the embodiments of the inventive concept are not limited thereto.

If the molding element 300 were to be formed at a wafer level (refer to FIGS. 9A and 9B), with the diameter 300R of the molding element 300 being less than a diameter 100R of a wafer substrate, an overhang would be formed at an edge of the wafer substrate. In such a scenario, if the overhang of the wafer substrate was damaged or cracked during moving, molding, peeling, and dicing processes, the yield rate and reliability of the semiconductor package would be decreased. However, since the method of manufacturing the wafer level semiconductor package 1000, according to an inventive concept, includes trimming the edge of the semiconductor wafer substrate 100 (refer to FIGS. 4A and 4B), forming the protection layer 400 on the semiconductor wafer substrate 100 (refer to FIGS. 5A and 5B), forming the adhesive layer 420 on the wafer carrier 500, attaching the protection layer 400 on the adhesive layer 420 (refer to FIGS. 6A and 6B), and then, forming the molding element 300 (refer to FIGS. 9A and 9B), a substrate overhang may be prevented from being formed at the edge of the semiconductor wafer substrate 100, and thus, the edge of the semiconductor wafer substrate 100 is prevented from being damaged or cracked. Therefore, the reliability of the wafer level semiconductor package 1000 is increased.

Figure 15:
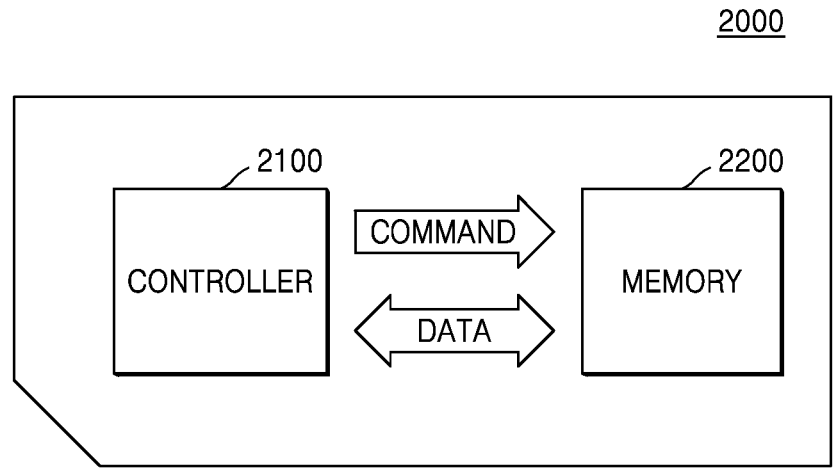
FIG. 15 is a schematic block diagram of a memory card including a semiconductor package according to some embodiments of the inventive concept.

FIG. 15 is a schematic block diagram of a memory card 2000 including the individual semiconductor packages 1100 and 1100-1 according to some embodiments of the inventive concept Referring to FIG. 15, a controller 2100 and a memory 2200 may be disposed to exchange electric signals in the memory card 2000. For example, when the controller 2100 transmits a command to the memory 2200, the memory 2200 may transmit data. The controller 2100 and/or memory 2200 may include the individual semiconductor packages 1100 and 1100-1 according to any one of the embodiments of the inventive concept. In detail, the controller 2100 may include the semiconductor wafer substrate 100 of the individual semiconductor packages 1100 and 1100-1 according to an embodiment of the inventive concept, and the memory 2200 may include the stacked semiconductor chip 200 of the individual semiconductor packages 1100 and 1100-1 according to an embodiment of the inventive concept.

The memory card 2000 may be used as a memory device, for example, a memory stick card, a smart media (SM) card, a secure digital (SD) card, a mini SD card, or a multimedia card (MMC).

Figure 16:
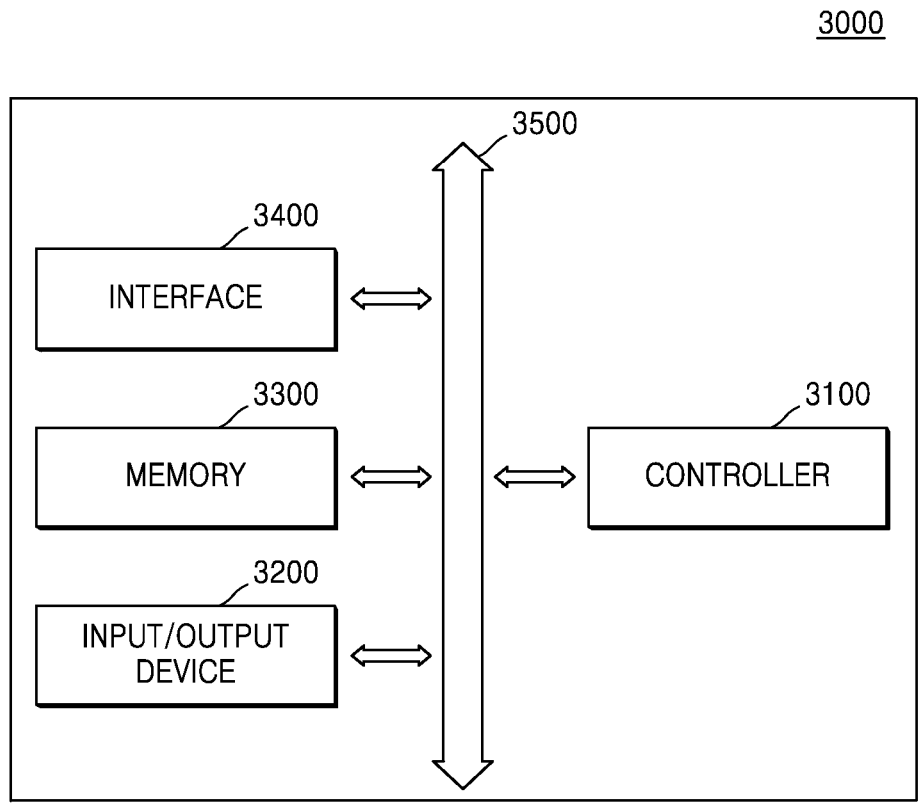
FIG. 16 is a schematic block diagram of an electronic system including a semiconductor package according to some embodiments of the inventive concept.

FIG. 16 is a schematic block diagram of an electronic system 3000 including the individual semiconductor packages 1100 and 1100-1 according to some embodiments of the inventive concept.

Referring to FIG. 16, the electronic system 3000 may include a controller 3100, an input/output (I/O) device 3200, a memory 3300, and an interface 3400. The electronic system 3000 may be a mobile system or a system transmitting or receiving information. The mobile system may be a personal digital assistant (PDA), a portable computer, a web tablet, a wireless phone, a mobile phone, a digital music player, or a memory card.

The controller 3100 may execute a program and control the electronic system 3000. The controller 3100 may be, for example, a microprocessor, a digital signal processor, or a micro-controller. The I/O device 3200 may be used to input or output data of the electronic system 3000.

The electronic system 3000 may be connected to an external device, for example, a personal computer or a network, via the I/O device 3200, and thus exchange data with the external device. The I/O device 3200 may be, for example, a keypad, a keyboard, or a display apparatus. The memory 3300 may store code and/or data for operations of the controller 3100, and/or data processed by the controller 3100. The controller 3100 and the memory 3300 may include the individual semiconductor packages 1100 and 1100-1 according to any embodiment of the inventive concept. In detail, the controller 3100 may include the semiconductor wafer substrate 100 of the individual semiconductor packages 1100 and 1100-1 according to an embodiment of the inventive concept, and the memory 3300 may include the stacked semiconductor chip 200 of the individual semiconductor packages 1100 and 1100-1 according to an embodiment of the inventive concept. The interface 3400 may be a data transmission path between the electronic system 3000 and another external device. The controller 3100, the I/O device 3200, the memory 3300, and the interface 3400 may communicate with each other via a bus 3500.

For example, the electronic system 3000 may be used in mobile phones, MP3 players, navigation devices, portable multimedia players (PMPs), solid state disks (SSDs), or household appliances.

Figure 17:
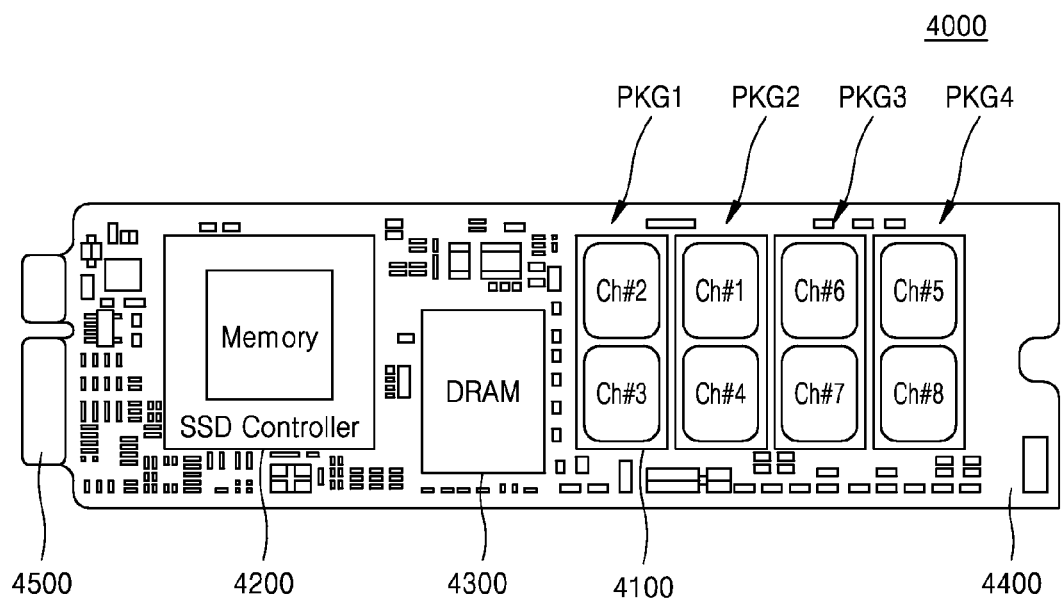
FIG. 17 is a schematic view of a structure of a solid state drive device using a semiconductor package according to an embodiment of the inventive concept.

FIG. 17 is a schematic view of a structure of a solid state drive (SSD) device 4000 to which the individual semiconductor packages 1100 and 1100-1 according to an embodiment of the inventive concept are applied. In particular, FIG. 17 illustrates an example to which the electronic system 3000 is applied to the SSD device 4000.

Referring to FIG. 17, the SSD device 4000 according to the present embodiment may include a memory package 4100, an SSD controller package 4200, DRAM 4300, and a main board 4400.

The memory package 4100, the SSD controller package 4200, and the DRAM 4300 may include the individual semiconductor packages 1100 and 1100-1 according to any embodiment of the inventive concept. The memory package 4100 may be mounted on the main board 4400 by using the external access terminal 140 of FIG. 1, and four memory packages PKG1, PKG2, PKG3, and PKG4 may be included therein as illustrated in FIG. 17. However, the memory package 4100 is not limited thereto, and more number of memory packages may be included depending on a channel support state of the SSD controller package 4200. When the memory package 4100 is formed as a multi-channel, there may be less than four memory packages.

The memory package 4100 may be mounted on the main board 4400 in a form of a ball grid array (BGA) package by using an external access terminal such as a solder ball. However, the embodiments of the inventive concept are not limited thereto, and the memory package 4100 may be mounted in a form of a pin grid array (PGA) package, a micro pillar grid array (MPGA) package, a tape carrier package (TCP), a chip-on-board (COB) structure, a quad flat non-leaded (QFN) structure, or a quad flat package (QFP).

The memory package 4100 may include at least one of the individual semiconductor packages 1100 or 1100-1 according to an embodiment of the inventive concept.

The SSD controller package 4200 may include, for example, eight (8) channels that may be connected one-to-one with the four memory packages PKG1, PKG2, PKG3, and PKG4 and thus control semiconductor chips in the memory package 4100.

The SSD controller package 4200 may include a program via which signals may be transmitted to or received from an external device according to any one of the serial advanced technology attachment (SATA) standard, the parallel ATA (PATA) standard, or the small computer system interface (SCSI) standard. The SATA standard may not only include the so-called SATA-1 standard, but also the SATA-2, SATA-3, and external SATA (e-SATA) standards. The PATA standard may include all kinds of integrated drive electronics (IDE)-related standards such as the IDE standard and the enhanced-IDE (E-IDE) standard.

Also, the SSD controller package 4200 may perform error correction code (ECC) or flash translation layer (FTL) processing. The SSD controller package 4200 may be mounted on the main board 4400 as a package. Like the memory package 4100, the SSD controller package 4200 may be mounted on the main board 4400 in the form of a BGA package, a PGA package, an MPGA package, a TCP, a COB structure, a QFN structure, or a QFP.

The SSD controller package 4200 may include at least one of the individual semiconductor packages 1100 or 1100-1 according to an embodiment of the inventive concept.

The DRAM 4300 is an auxiliary memory device which may function as a buffer when the SSD controller package 4200 and the memory package 4100 are exchanging data. The DRAM 4300 may also be mounted on the main board 4400 in various forms, for example, in the form of a BGA package, a PGA package, a TCP, a COB structure, a QFN structure, and a QFP.

The main board 4400 may be a PCB, a flexible PCB, an organic substrate, a ceramic substrate, a tape substrate, or the like. The main board 4400 may include, for example, a core board having upper and lower surfaces and a resin layer formed on each of the upper and lower surfaces of the core board. Also, the resin layers may have a multi-layer structure, and a signal layer, a ground layer, or a power layer, which form wiring patterns, may be provided between the resin layers. An additional wiring pattern may be formed on the resin layers. In FIG. 17, small patterns illustrated on the main board 4400 may indicate wiring patterns or a plurality of passive components. An interface 4500 for communicating with external devices may be formed on a side of the main board 4400, for example, a left side thereof.

Figure 18:
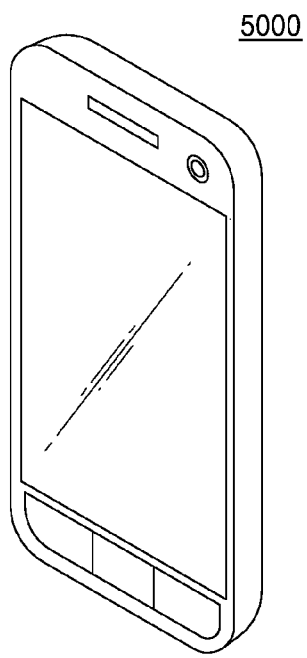
FIG. 18 is a schematic perspective view of an electronic device to which a semiconductor package according to an embodiment of the inventive concept is applied.

FIG. 18 is a schematic perspective view of an electronic device to which the individual semiconductor packages 1100 and 1100-1 are applied according to an embodiment of the inventive concept.

FIG. 18 illustrates an example of a mobile phone 5000 to which the electronic system 3000 may be applied, or with which the electronic system 300 may be otherwise included. In addition, the electronic system 3000 may be applied to portable computers, MP3 players, navigation devices, SSDs, automobiles, or household appliances, or with which the electronic system 300 may be otherwise included.

While the inventive concept has been particularly shown and described with reference to exemplary embodiments thereof, it will be understood that various changes in form and details may be made therein without departing from the spirit and scope of the following claims.

What is claimed is:

1. A method of manufacturing stacked semiconductor packages, the method comprising:
    preparing a wafer substrate comprising a first surface in which an active area is formed and a second surface that is opposite to the first surface;
    forming a first through electrode extending by a predetermined length from the second surface toward the first surface;
    trimming an edge of the second surface in predetermined intervals and by a predetermined thickness, thereby forming a trimmed wafer substrate surface;
    forming a protection layer that covers the second surface and a first portion of the trimmed wafer substrate surface such that a second portion of the trimmed wafer substrate surface is exposed;
    forming an adhesive layer on a wafer carrier;
    attaching the wafer substrate and the protection layer on the adhesive layer such that the adhesive layer covers an upper surface and a side surface of the protection layer;
    exposing an upper portion of the first through electrode by grinding the first surface;
    stacking a plurality of semiconductor chips on the first surface, at least one of which is electrically connected to the first through electrode;
    forming a molding element to cover the first surface of the wafer substrate and the plurality of semiconductor chips, wherein a diameter of the molding element is greater than a diameter of the wafer substrate and less than respective diameters of the protection layer and the adhesive layer; and
    sequentially removing the wafer carrier and the adhesive layer.

2. The method of claim 1, after removing the wafer carrier and the adhesive layer, further comprising performing a singulation process to form individual stacked semiconductor packages by cutting the wafer substrate and the molding element such that each of the stacked semiconductor packages comprises at least one stacked semiconductor chip.

3. The method of claim 1, further comprising after forming the first through electrode, forming a release layer that covers the second surface of the wafer substrate.

4. The method of claim 3, wherein the release layer is formed of polymer.

5. The method of claim 1, further comprising:
    forming an access pad on the second surface of the wafer substrate after forming the first through electrode;
    forming a passivation layer such that the second surface of the wafer substrate is covered, a side surface of the access pad is surrounded, and an upper surface of the access pad is exposed; and
    forming, on the protection layer, an external access terminal, which is electrically connected to the access pad.

6. The method of claim 1, wherein the adhesive layer is formed to cover a side surface of the trimmed edge of the second surface of the wafer substrate, and to cover the second portion of the trimmed wafer substrate surface.

7. The method of claim 1, further comprising cleaning the wafer substrate after trimming the edge of the second surface.

8. The method of claim 1, wherein forming the adhesive layer includes forming the adhesive layer on the wafer carrier by using a spin coating method.

9. The method of claim 1, wherein attaching the wafer substrate and the protection layer on the adhesive layer of the wafer carrier comprises attaching by curing the adhesive layer using a thermal bonding method.

10. The method of claim 1, further comprising after forming the molding element, turning over the wafer substrate and attaching the wafer substrate and the molding element to a dicing tape such that an upper surface of the molding element contacts the dicing tape.

11. A method of manufacturing a semiconductor package, the method comprising:
    forming a first semiconductor chip comprising a first surface on which an external access terminal is formed, and a first through electrode that penetrates at least a portion of an area between the first surface and a second surface that is opposite to the first surface;
    trimming an edge of the first surface in predetermined intervals and by a predetermined thickness;
    forming a first protection layer to cover a side surface of a trimmed edge of the first surface;
    forming a second protection layer to cover an exposed upper surface of the trimmed edge of the first surface and an upper surface and a side surface of the first protection layer;
    stacking a plurality of second semiconductor chips, at least one of which is connected to the first through electrode, on the second surface;
    forming a molding element such that upper surfaces and side surfaces of the plurality of second semiconductor chips are covered and the first and second protection layers are partially exposed;
    removing the second protection layer;
    trimming an edge of the first protection layer such that an edge of the molding element is partially exposed; and
    removing the first protection layer.

12. The method of claim 11, further comprising after removing the first protection layer, performing a singulation process to form an individual semiconductor package by cutting the molding element and the first semiconductor chip such that at least one second semiconductor chip from among the plurality of second semiconductor chips is included in the individual semiconductor package.

13. The method of claim 11, further comprising after forming the external access terminal, forming a release layer on the first surface of the first semiconductor chip and an upper surface of the external access terminal by spin coating an ultraviolet film.

14. The method of claim 11, wherein the first semiconductor chip and the plurality of second semiconductor chips are different types of semiconductor chips.

15. The method of claim 11, wherein the second protection layer is formed as an adhesive layer, and
    after forming the second protection layer, the method further comprises attaching the second protection layer to a wafer carrier.

16. A wafer level semiconductor package, comprising:
    a circular substrate having a first diameter;
    a circular passivation layer attached to the circular substrate, the passivation layer having the first diameter;
    a plurality of access terminals arranged on the passivation layer;
    a plurality of first access pads each connected to a corresponding one of the access terminals;

a plurality of first through electrodes each electrically connected to a corresponding one of the first access pads, the plurality of first through electrodes extending through the passivation layer and the substrate;

a plurality of second access pads each electrically connected to a corresponding one of the first through electrodes;

a plurality of first semiconductor chips each electrically connected to a corresponding one of the first through electrodes via a corresponding one of the second access pads;

a plurality of second through electrodes each passing through a corresponding one of the plurality of first semiconductor chips;

a plurality of second semiconductor chips each electrically connected to a corresponding one of the second through electrodes; and a circular molding element covering surfaces of the plurality of first semiconductor chips and the plurality of second semiconductor chips, and covering an active area of the substrate, the circular molding element having a second diameter that is greater than the first diameter.

17. The wafer level semiconductor package of claim 16, further comprising:

a plurality of third through electrodes each passing through a corresponding one of the plurality of second semiconductor chips; and a plurality of third semiconductor chips each electrically connected to a corresponding one of the third through electrodes.

18. The wafer level semiconductor package of claim 17, wherein the circular molding element covers surfaces of the plurality of third semiconductor chips.

19. The wafer level semiconductor package of claim 16, wherein the molding element includes at least one of an epoxy-based material, a thermosetting material, a thermoplastic material, or a UV processing material.

* * * * *